(12) United States Patent
Pick et al.

(10) Patent No.: US 12,309,987 B2
(45) Date of Patent: May 20, 2025

(54) ELECTROMAGNETIC WAVEGUIDE WITH AN EMI SHIELDING GASKET

(71) Applicant: Q-FLO LIMITED, Sevenoaks (GB)

(72) Inventors: Martin Pick, Doncaster (GB); Adam Boies, Cambridge (GB); Sean Howard, Essex (GB); Meir Hefetz, Harashim (IL); Sahar Tenenbaum, Lower Galilee (IL); Ortal Tiurin, Haifa (IL); Victor Halperin, Haifa (IL); Yehoshua Yeshurun, Haifa (IL); Liron Issman, Cambridge (GB); Jeronimo Terrones Portas, Cambridge (GB)

(73) Assignee: Q-FLO LIMITED, Sevenoaks (GB)

( * ) Notice: Subject to any disclaimer, the term of this patent is extended or adjusted under 35 U.S.C. 154(b) by 348 days.

(21) Appl. No.: 17/641,168

(22) PCT Filed: Sep. 8, 2020

(86) PCT No.: PCT/GB2020/052153
§ 371 (c)(1),
(2) Date: Mar. 8, 2022

(87) PCT Pub. No.: WO2021/048532
PCT Pub. Date: Mar. 18, 2021

(65) Prior Publication Data
US 2022/0346292 A1    Oct. 27, 2022

(30) Foreign Application Priority Data
Sep. 9, 2019  (GB) .................................... 1912962

(51) Int. Cl.
*H05K 9/00*    (2006.01)
*H01P 3/12*    (2006.01)

(52) U.S. Cl.
CPC ............. *H05K 9/0081* (2013.01); *H01P 3/12* (2013.01)

(58) Field of Classification Search
CPC ...... H05K 9/0081; H05K 9/0015; H01P 3/12; H01P 1/042
See application file for complete search history.

(56) References Cited

U.S. PATENT DOCUMENTS 4,932,673 A * 6/1990 Domnikov .............. H01P 1/042
                                                              277/936
5,629,657 A * 5/1997 Bayorgeon .............. H01P 1/042
                                                              333/254
(Continued)

FOREIGN PATENT DOCUMENTS

| CN | 101816224 A | 8/2010 |
| CN | 102461361 A | 5/2012 |

(Continued)

OTHER PUBLICATIONS

Chinese Office Action Application No. 202080075860.5 Dated Feb. 27, 2024.
(Continued)

*Primary Examiner* — Quan Tra
(74) *Attorney, Agent, or Firm* — FOLEY & LARDNER LLP

(57) ABSTRACT

The present invention relates to an electromagnetic waveguide comprising an electromagnetic interference shielding gasket which includes a self-supporting body of non-woven carbon nanotubes adapted to incorporate one or more apertures and to the electromagnetic interference shielding gasket per se.

20 Claims, 32 Drawing Sheets

(56) References Cited

U.S. PATENT DOCUMENTS

| | | | | |
|---|---|---|---|---|
| 10,135,104 | B2* | 11/2018 | Bolander | H01P 1/042 |
| 2009/0058571 | A1* | 3/2009 | Takemoto | H01P 1/042 |
| | | | | 333/254 |
| 2012/0280762 | A1 | 11/2012 | Hauff | |
| 2014/0097917 | A1 | 4/2014 | Shah et al. | |
| 2014/0291589 | A1* | 10/2014 | Hata | C01B 32/16 |
| | | | | 252/511 |
| 2017/0238447 | A1* | 8/2017 | Lin | H05K 9/009 |
| | | | | 174/377 |
| 2019/0159300 | A1 | 5/2019 | Khizar et al. | |
| 2020/0403288 | A1* | 12/2020 | Vendier | H01P 3/12 |
| 2022/0080681 | A1* | 3/2022 | Ghazizadeh | B29C 35/12 |
| 2022/0304202 | A1* | 9/2022 | Snygg | H05K 9/0015 |

FOREIGN PATENT DOCUMENTS

| | | |
|---|---|---|
| CN | 104488134 A1 | 4/2015 |
| DE | 20 2012 008 505 U1 | 12/2012 |
| KR | 100666143 B1 | 1/2007 |
| WO | WO-2016/205788 A1 | 12/2016 |

OTHER PUBLICATIONS

Israel Office Action on IL Application No. 291156 Dated Feb. 26, 2024.

Xue-hong Cao, et al., "Research Situation and Development of Paper-based Electromagnetic Shielding Materials," Paper Science & Technology, vol. 37, No. 5, Oct. 15, 2018 (6 pages; English translation of Abstract on last page).

International Search Report and Written Opinion on PCT/GB2020/052153, mailed on Dec. 22, 2020 (12 pages).

Thurid S Gspann, et al: "Supplementary Information High thermal conductivities of carbon nanotube films and micro-fibres and their dependence on morphology", Apr. 30, 2017, XP055759527, Retrieved from the Internet: URL: https://ars.els-cdn.com/content/image/1-s2.0-S0008622316310752-mmc1.pdf (20 pages).

Ya-Li Li, et al: "Direct Spinning of Carbon Nanotube Fibers from Chemical Vapor Deposition Synthesis", Science, vol. 304, pp. 276-278, XP008128720, Apr. 9, 2004; ISSN: 0036-8075, DOI : 10.1126/SCIENCE. 1094982 [retrieved on Mar. 11, 2004].

* cited by examiner

| Frequency (GHz) | Attenuation (dB) |
| --- | --- |
| 25 | 63.1 |
| 30 | 62.8 |
| 35 | 61.6 |
| 40 | 77.1 |
| 45 | 69.3 |
| 50 | 72.0 |
| 55 | 61.8 |
| 60 | 64.1 |
| 65 | 57.3 |
| 70 | 59.3 |
| 75 | 62.9 |
| 80 | 65.8 |
| 85 | 57.4 |
| 90 | 62.1 |
| 95 | 59.7 |
| 100 | 62.2 |

| Frequency (GHz) | Attenuation (dB) |
|---|---|
| 25 | 103.0 |
| 30 | 118.2 |
| 35 | 114.3 |
| 40 | 118.3 |
| 45 | 100.2 |
| 50 | 106.5 |
| 55 | 121.0 |
| 60 | 118.4 |
| 65 | 121.3 |
| 70 | 120.2 |
| 75 | 116.0 |
| 80 | 107.3 |
| 85 | 109.1 |
| 90 | 112.1 |
| 95 | 111.2 |
| 100 | 111.5 |

| Frequency (GHz) | Attenuation (dB) |
| --- | --- |
| 25 | 88.0 |
| 30 | 93.1 |
| 35 | 94.5 |
| 40 | 98.0 |
| 45 | 92.6 |
| 50 | 91.2 |

| Frequency (GHz) | Attenuation (dB) |
|---|---|
| 25 | 101.2 |
| 30 | 103.8 |
| 35 | 104.6 |
| 40 | 101.6 |
| 45 | 96.0 |
| 50 | 101.5 |
| 55 | 114.3 |
| 60 | 120.0 |
| 65 | 122.3 |
| 70 | 118.2 |
| 75 | 116.0 |
| 80 | 111.3 |
| 85 | 109.1 |
| 90 | 113.0 |
| 95 | 111.2 |
| 100 | 112.5 |

| Frequency (GHz) | Attenuation (dB) |
|---|---|
| 25 | 98.3 |
| 30 | 110.2 |
| 35 | 108.6 |
| 40 | 102.9 |
| 45 | 101.6 |
| 50 | 102.4 |
| 55 | 123.7 |
| 60 | 113.4 |
| 65 | 121.3 |
| 70 | 120.2 |
| 75 | 116.0 |

| Frequency (GHz) | Attenuation (dB) |
| --- | --- |
| 25 | 92.2 |
| 30 | 109.5 |
| 35 | 116.8 |
| 40 | 101.2 |
| 45 | 109.9 |
| 50 | 106.6 |
| 55 | 114.0 |
| 60 | 109.1 |
| 65 | 118.4 |
| 70 | 120.2 |
| 75 | 118.0 |
| 80 | 107.3 |
| 85 | 109.1 |
| 90 | 113.0 |
| 95 | 111.2 |
| 100 | 112.5 |

| Frequency (GHz) | Attenuation (dB) |
|---|---|
| 25 | 85.2 |
| 30 | 87.2 |
| 35 | 89.2 |
| 40 | 96.6 |
| 45 | 94.9 |
| 50 | 89.4 |

| Frequency (GHz) | Attenuation (dB) |
| --- | --- |
| 55 | 49.2 |
| 60 | 57.5 |
| 65 | 66.7 |
| 70 | 64.4 |
| 75 | 60.9 |
| 80 | 53.0 |
| 85 | 47.6 |
| 90 | 48.9 |
| 95 | 60.5 |
| 100 | 50.5 |

ELECTROMAGNETIC WAVEGUIDE WITH AN EMI SHIELDING GASKET

CROSS-REFERENCE TO RELATED APPLICATIONS

This application is a U.S. National Stage Application under 35 U.S.C. § 371 of International Patent Application No. PCT/GB2020/052153, filed on Sep. 8, 2020, which claims priority to Great Britain Patent Application No. 1912962.6, filed on Sep. 9, 2019, the content of each of which is incorporated herein by reference in their entireties The present invention relates to an electromagnetic waveguide comprising an electromagnetic interference shielding gasket which includes a self-supporting body of non-woven carbon nanotubes adapted to incorporate one or more apertures and to the electromagnetic interference shielding gasket per se.

Waveguide gaskets are commonly used to provide effective shielding from electromagnetic interference (EMI) and pressure sealing for flanges, covers and chokes. Gaskets may be made of a non-conductive material (eg neoprene) or a conductive material (eg copper) to suit the required functionality.

The present invention is based on the recognition that a self-supporting body of non-woven carbon nanotubes has electromagnetic interference (EMI) shielding capabilities across an extremely broad band of frequencies (typically MHz up to 100 GHz) and unexpected attenuation values even at low areal densities. The ability of the self-supporting body of non-woven carbon nanotubes to be easily shaped and to elastically compress facilitates its deployment as (for example) an effective electromagnetic interference (EMI) shielding gasket.

Viewed from a first aspect the present invention provides an electromagnetic waveguide comprising:
   a first waveguide section;
   a second waveguide section;
   a first flange mounted on an end of the first waveguide section;
   a second flange mounted on an end of the second waveguide section, wherein the first flange is connected (eg sealingly connected) to the second flange; and
   an EMI shielding gasket mounted between the first flange and the second flange, wherein the EMI shielding gasket includes a self-supporting body of non-woven carbon nanotubes adapted to incorporate one or more apertures.

Under compression, the EMI shielding gasket seals effectively the joint between the first flange and second flange. With the ability to optimize the thickness, mechanical properties (via the manufacturing process), shape and surface chemistry (eg by coating), the EMI shielding gasket is a versatile, cost-effective and high end shielding solution for the electromagnetic waveguide of the invention.

The self-supporting body of non-woven carbon nanotubes may be adapted to incorporate a plurality of apertures with the same or different shapes. The self-supporting body of non-woven carbon nanotubes may be adapted to incorporate a single aperture. The profile of the (or each) aperture may be substantially circular, square or rectangular.

The self-supporting body of non-woven carbon nanotubes may be laminate. The self-supporting body of non-woven carbon nanotubes may be fibrous. For example, the supporting body of non-woven carbon nanotubes may be a fibre, film, ribbon, strand, sheet, mesh or mat.

The self-supporting body of non-woven carbon nanotubes may be substantially planar. The profile of the planar self-supporting body of non-woven carbon nanotubes may be complementary to (eg substantially match) the profile of the first flange and second flange. The profile of the planar self-supporting body of non-woven carbon nanotubes may be substantially circular, square or rectangular.

The self-supporting body of non-woven carbon nanotubes may be substantially annular. The annular self-supporting body of non-woven carbon nanotubes may be substantially circular (eg an O-ring or D-ring) or rectangular. The cross-section of the annular self-supporting body of non-woven carbon nanotubes may be substantially O-shaped or D-shaped.

The annular self-supporting body of non-woven carbon nanotubes may be seated in an annular recess in a connecting face of the first flange and/or second flange.

The self-supporting body of non-woven carbon nanotubes may be combined with an additional material.

The additional material may be particulate or fibrous or a coating.

The additional material may be a polymer (eg a conductive or non-conductive polymer), a metal or a non-metal (eg carbon).

The polymer may be an elastomer. The polymer may be a thermoplastic, thermoformable or thermosetting polymer. The thermoformable polymer may be acrylonitrile butadiene styrene (ABS). The polymer may be chemically active (eg polymerizable or cross-linkable).

The self-supporting body of non-woven carbon nanotubes may be combined with the additional material by well-known techniques such as vacuum forming, lamination, weaving, braiding, wrapping, dispersion or bonding (eg thermal or chemical bonding or plating).

Preferably the self-supporting body of non-woven carbon nanotubes is coated. Particularly preferably the self-supporting body of non-woven carbon nanotubes is coated with a polymer (eg a conductive or non-conductive polymer).

A coating may be a full coating or a partial coating. Preferably the coating is a partial coating. The partial coating may be achieved using a low molecular weight polymer and leaves exposed advantageously non-woven carbon nanotubes.

Preferably the polymer impregnates the self-supporting body of non-woven carbon nanotubes. This may be achieved using a low molecular weight polymer and serves advantageously to improve the mechanical behaviour of the self-supporting body of non-woven carbon nanotubes.

In a preferred embodiment, the polymer is polyvinylpyrrolidone (PVP). Particularly preferably the polymer is low molecular weight PVP. An advantage of this embodiment is that PVP enhances the cohesive strength of the self-supporting body of non-woven carbon nanotubes.

The polymer may be a silicone.

In a preferred embodiment, the self-supporting body of non-woven carbon nanotubes is coated with a non-conductive polymer. Preferably the non-conductive polymer is a fluoropolymer. Particularly preferred is polyvinylidene difluoride (PVDF) or a copolymer or terpolymer thereof.

In a preferred embodiment, the self-supporting body of non-woven carbon nanotubes is coated with a conductive polymer.

The self-supporting body of non-woven carbon nanotubes may be coated with a mixture of one or more polymers (eg conductive or non-conductive polymers) as hereinbefore defined.

The first flange and second flange may be the same or different. Typically the first flange and second flange are the same. The first flange and second flange may be a contact flange, cover flange or choke flange.

The connecting face of each of the first flange and the second flange may be substantially square, circular, octagonal or rectangular. The first flange and second flange may include a z-axis feature such as a slope, taper or indent.

The first flange and second flange may be connected threadedly or with a plurality of fasteners (eg bolts or pins).

The connection between the first flange and second flange may be air-tight. The connection between the first flange and second flange may be a contact connection or choke connection.

The first waveguide section and second waveguide section may be the same or different. Typically the first waveguide section and second waveguide section are the same.

The first waveguide section and second waveguide section may be an elongate hollow conductive conduit (eg a metal pipe). The first flange may be socket-mounted or through-mounted on the first waveguide section. The second flange may be socket-mounted or through-mounted on the second waveguide section.

The self-supporting body of non-woven carbon nanotubes may be adapted to incorporate the one or more apertures by moulding or cutting (eg laser, water, blade, air or die-cutting).

The one or more apertures may include an opening (eg a substantially central opening) for electromagnetic radiation. The one or more apertures may include fastening apertures for receiving fasteners which connect the first flange and second flange.

Preferably the areal density of the self-supporting body of non-woven carbon nanotubes is 60 gsm or less. Particularly preferably the areal density of the self-supporting body of non-woven carbon nanotubes is 30 gsm or less. More preferably the areal density of the self-supporting body of non-woven carbon nanotubes is 20 gsm or less.

Preferably the surface of the self-supporting body of non-woven carbon nanotubes is non-uniform. For example, the surface of the self-supporting body of non-woven carbon nanotubes may be crimped, dimpled, corrugated or undulatory.

Preferably the thickness of the self-supporting body of non-woven carbon nanotubes is subject to variation by up to 20%.

The self-supporting body of non-woven carbon nanotubes may be provided with a polymer core. The polymer core may be an elastomer core or a thermosetting or thermoplastic polymer core.

Preferably the EMI shielding gasket is obtainable or obtained from a process comprising:
(a) introducing a flow of metal catalyst or metal catalyst precursor into a temperature-controlled flow-through reactor;
(b) introducing a flow of a source of carbon into the temperature-controlled flow-through reactor;
(c) exposing the metal catalyst or metal catalyst precursor and source of carbon to temperature zones sufficient to generate particulate metal catalyst and to produce carbon nanotubes;
(d) displacing the carbon nanotubes as a continuous discharge through a discharge outlet of the temperature-controlled flow-through reactor;
(e) collecting the continuous discharge in the form of a self-supporting body of non-woven carbon nanotubes; and
(f) adapting the self-supporting body of non-woven carbon nanotubes to incorporate one or more apertures.

Typically the particulate metal catalyst is a nanoparticulate metal catalyst. Preferably the nanoparticles of the nanoparticulate metal catalyst have a mean diameter (eg a number, volume or surface mean diameter) in the range 1 to 50 nm (preferably 1 to 10 nm). Preferably 80% or more of the particles of the nanoparticulate metal catalyst have a diameter of less than 30 nm. Particularly preferably 80% or more of the particles of the nanoparticulate metal catalyst have a diameter of less than 12 nm. The concentration of the particulate metal catalyst may be in the range $10^6$ to $10^{10}$ particles $cm^{-3}$.

Typically the metal catalyst is one or more of the group consisting of alkali metals, transition metals, rare earth elements (eg lanthanides) and actinides. Preferably the metal catalyst is one or more of the group consisting of transition metals, rare earth elements (eg lanthanides) and actinides.

Preferably the metal catalyst is at least one of the group consisting of Fe, Ru, Co, W, Cr, Mo, Rh, Ir, Os, Ni, Pd, Pt, Ru, Y, La, Ce, Mn, Pr, Nd, Tb, Dy, Ho, Er, Lu, Hf, Li and Gd. Preferably the metal catalyst is iron.

The metal catalyst precursor may be a metal complex or organometallic metal compound. Examples include iron pentacarbonyl, ferrocene or a ferrocenyl derivative (eg ferrocenyl sulphide).

Preferably the metal catalyst precursor is sulphur-containing. A metal catalyst precursor which is sulphur-containing may promote carbon nanotube growth.

Preferably the metal catalyst precursor is a sulphur-containing organometallic. Particularly preferably the metal catalyst precursor is a sulphur-containing iron organometallic. More preferably the metal catalyst precursor is a sulphur-containing ferrocenyl derivative. Yet more preferably the metal catalyst precursor is mono-(methylthio) ferrocene or bis-(methylthio) ferrocene.

The flow rate of the metal catalyst or metal catalyst precursor may be in the range 1 to 50 g/hour (eg about 7 g/hour).

The metal catalyst or metal catalyst precursor may be introduced in step (a) together with a sulphur-containing additive. The sulphur-containing additive may promote carbon nanotube growth. The sulphur-containing additive may be thiophene, iron sulphide, a sulphur-containing ferrocenyl derivative (eg ferrocenyl sulphide), hydrogen sulphide or carbon disulphide.

In a preferred embodiment, the sulphur-containing additive is thiophene or carbon disulphide. Particularly preferably the sulphur-containing additive is thiophene.

In a preferred embodiment, the metal catalyst precursor is ferrocene optionally together with a sulphur-containing additive (preferably thiophene or carbon disulphide).

The flow rate of the sulphur-containing additive may be in the range 0.1 to 10 g/hour (eg about 5 g/hour).

The metal catalyst or metal catalyst precursor introduced in step (a) may be in a gaseous, liquid or solid form. The metal catalyst or metal catalyst precursor may be introduced in step (a) with a non-metal catalyst modifier or precursor thereof. The non-metal catalyst modifier may be chalcogen-containing (eg sulphur-containing).

The generation of particulate metal catalyst may be initiated in step (c) by thermal decomposition or dissociation of the metal catalyst or metal catalyst precursor into metal species (eg atoms, radicals or ions). The generation of particulate metal catalyst in step (c) may comprise nucleation of the metal species into nucleated metal species (eg clusters). The generation of particulate metal catalyst may comprise growth of the nucleated metal species into the particulate metal catalyst.

The metal catalyst or metal catalyst precursor may be introduced (eg injected) in step (a) in a linear, axial, vortical, helical, laminar or turbulent flow path. The metal catalyst or metal catalyst precursor may be introduced at a plurality of locations.

In step (a), the metal catalyst or metal catalyst precursor may be introduced axially or radially into the temperature-controlled flow-through reactor. The metal catalyst or metal catalyst precursor may be introduced axially through a probe or injector.

The metal catalyst or metal catalyst precursor may be in a mixture with a carrier gas. The carrier gas is typically one or more of nitrogen, argon, helium or hydrogen. The mass flow of the metal catalyst or metal catalyst precursor in admixture with the carrier gas is generally in the range 10 to 30 lpm.

Before step (b), the source of carbon may be heated.

Before step (b), the source of carbon may be subjected to radiative heat transfer by a source of infrared, visible, ultraviolet or x-ray energy.

In step (b) the source of carbon may be introduced (eg injected) in a linear, axial, vortical, helical, laminar or turbulent flow path.

In step (b), the source of carbon may be introduced axially or radially into the temperature-controlled flow-through reactor. The source of carbon may be introduced axially through a probe or injector. The source of carbon may be introduced at a plurality of locations. The source of carbon may be an optionally substituted and/or optionally hydroxylated aromatic or aliphatic, acyclic or cyclic hydrocarbon (eg alkyne, alkane or alkene) which is optionally interrupted by one or more heteroatoms (eg oxygen). Preferred is an optionally halogenated $C_{1-6}$-hydrocarbon (eg methane, propane, ethylene, acetylene or tetrachloroethylene), an optionally mono-, di- or tri-substituted benzene derivative (eg toluene) or $C_{1-6}$-alcohol (eg ethanol).

Preferably the source of carbon is methane optionally (but preferably) in the presence of an optionally substituted and/or optionally hydroxylated aromatic or aliphatic, acyclic or cyclic hydrocarbon (eg alkyne, alkane or alkene) which is optionally interrupted by one or more heteroatoms (eg oxygen).

The source of carbon may be a $C_{1-6}$-hydrocarbon such as methane, ethylene or acetylene.

The source of carbon may be an alcohol such as ethanol or butanol.

The source of carbon may be an aromatic hydrocarbon such as benzene or toluene.

In a preferred embodiment, the source of carbon is methane optionally in the presence of propane or acetylene.

The flow rate of the source of carbon may be in the range 50 to 30000 sccm (eg 2000 sccm). Typically in step (b), the source of carbon is introduced with a carrier gas such as helium, hydrogen, nitrogen or argon.

The flow rate of the carrier gas may be in the range 1000 to 50000 sccm (eg 30000 sccm). In a preferred embodiment, steps (a) and (b) are concurrent. For this purpose, the metal catalyst or metal catalyst precursor is preferably suspended or dissolved in the source of carbon. Particularly preferably the metal catalyst or metal catalyst precursor and a sulphur-containing additive are suspended or dissolved in the source of carbon. For example, ferrocene and thiophene may be dissolved in an organic solvent such as butanol, ethanol, benzene or toluene and the solution may be introduced (eg injected) into the temperature-controlled flow-through reactor.

The carbon nanotubes may be single-walled and/or multi-walled carbon nanotubes. In step (c), the carbon nanotubes structure may take the form of a 3D continuous network (eg an aerogel).

The temperature-controlled flow-through reactor may be cylindrical or another geometry. The temperature-controlled flow-through reactor may be substantially vertical or horizontal. Preferably the temperature-controlled flow-through reactor is substantially horizontal.

The walls of the temperature-controlled flow-through reactor may be selectively cooled by exposure to a cooling fluid such as water, liquid nitrogen or liquid helium.

The temperature-controlled flow-through reactor may be adapted to provide an axial temperature gradient. The axial temperature gradient may be non-uniform (eg stepped). The temperature of the temperature-controlled flow-through reactor may be controlled by resistive heating, plasma or laser.

Preferably the temperature profile in the temperature-controlled flow-through reactor is substantially parabolic.

The temperature zones sufficient to generate particulate metal catalyst and to produce carbon nanotubes may extend over at least the range 600 to 1500° C.

The temperature-controlled flow-through reactor may be adapted to introduce reactants by an injection nozzle, lance, probe or a multi-orificial injector (eg a shower head injector).

Step (d) may be carried out by a mechanical, electrostatic or magnetic force.

Step (e) may be carried out mechanically. For example, step (e) may be carried out on a rotary spindle or drum.

The process may further comprise cutting, chopping, shaping, laying, flattening, stretching, unrolling, aligning, combing, heating, vibrating or reinforcing the self-supporting body of non-woven carbon nanotubes.

The process may further comprise chemically adapting the self-supporting body of non-woven carbon nanotubes.

The process may further comprise densifying the self-supporting body of non-woven carbon nanotubes. Densification is typically followed by air-drying.

The process may further comprise coating the self-supporting body of non-woven carbon nanotubes.

Preferably the electrical conductivity of the self-supporting body of non-woven carbon nanotubes is in the range $10^3$ to $10^6$ S/m, particularly preferably in the range 10000 to 500000 S/m.

The areal density of the self-supporting body of non-woven carbon nanotubes may be varied by varying the duration of step (e).

Viewed from a further aspect the present invention provides an EMI shielding gasket as hereinbefore defined.

Viewed from a yet further aspect the present invention provides the use of a self-supporting body of non-woven carbon nanotubes as hereinbefore defined for EMI (eg RFI) shielding.

The use of a self-supporting body of non-woven carbon nanotubes for EMI shielding is preferably as or in a shielding gasket, shielding enclosure, shield can, shield card, shielded backplane, shield room, shield tape or shielded cable.

The present invention will now be described in a non-limitative sense with reference to the accompanying Figures in which.

EXAMPLE 1

Figure 1:
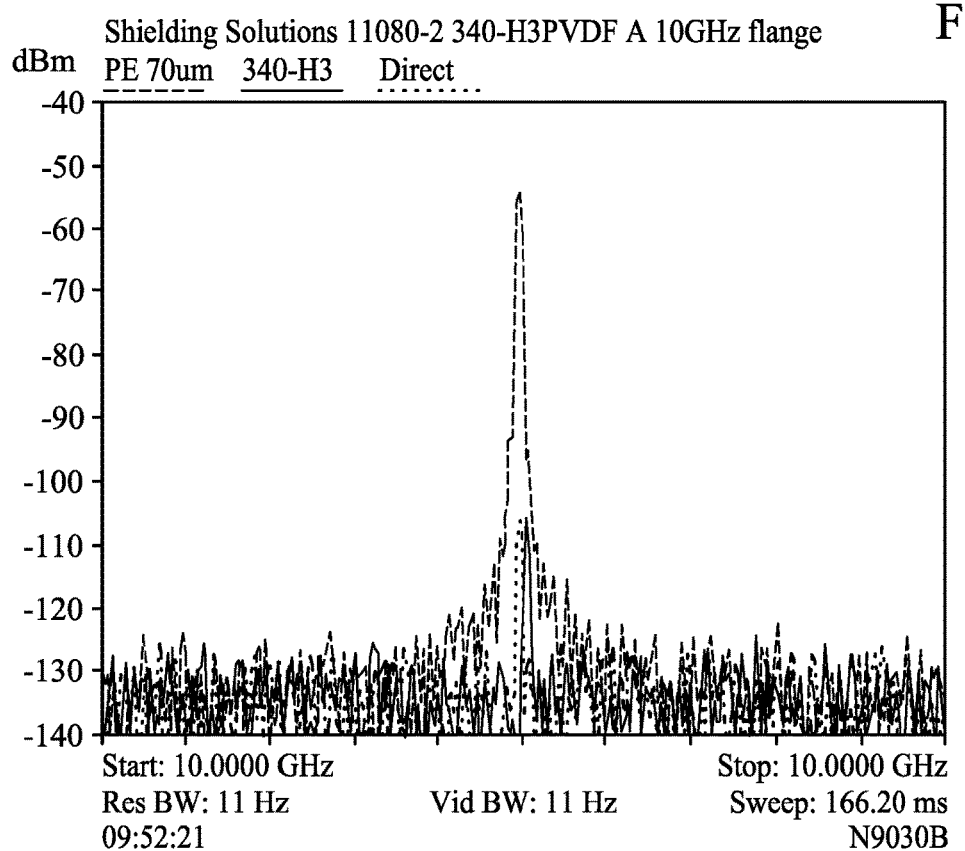
FIGS. 1 to 32 are attenuation plots demonstrating the shielding performance of representative embodiments of EMI shielding gaskets according to the invention.
Figure 2:
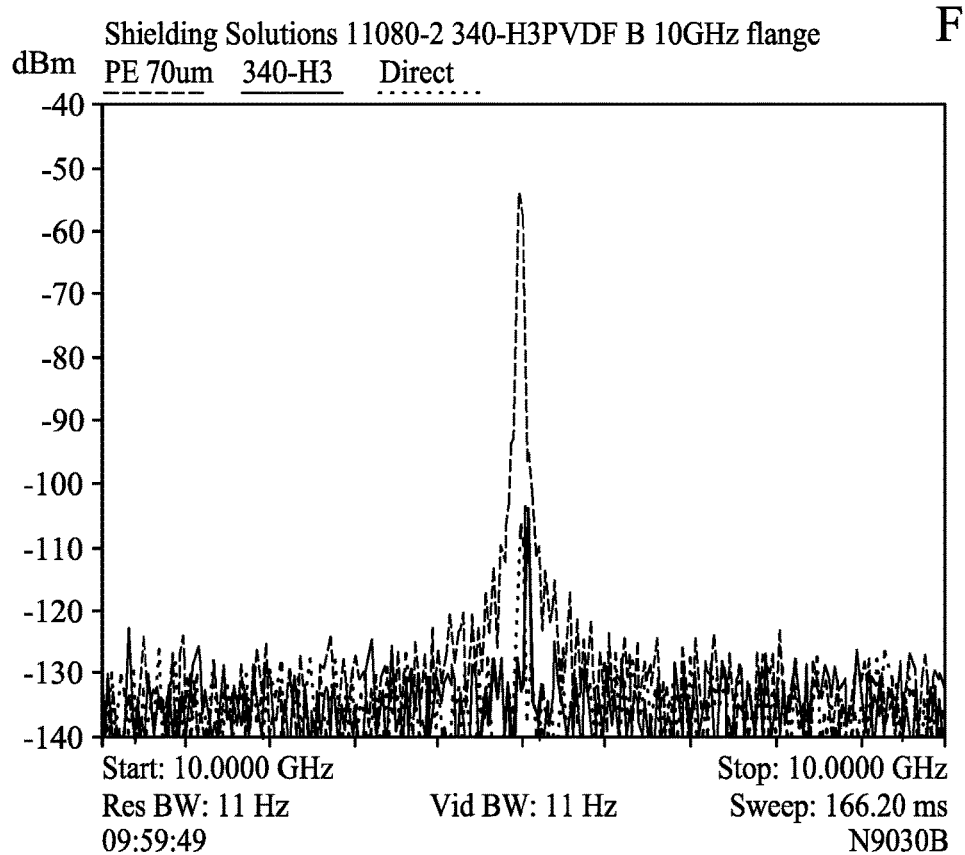
Figure 3:
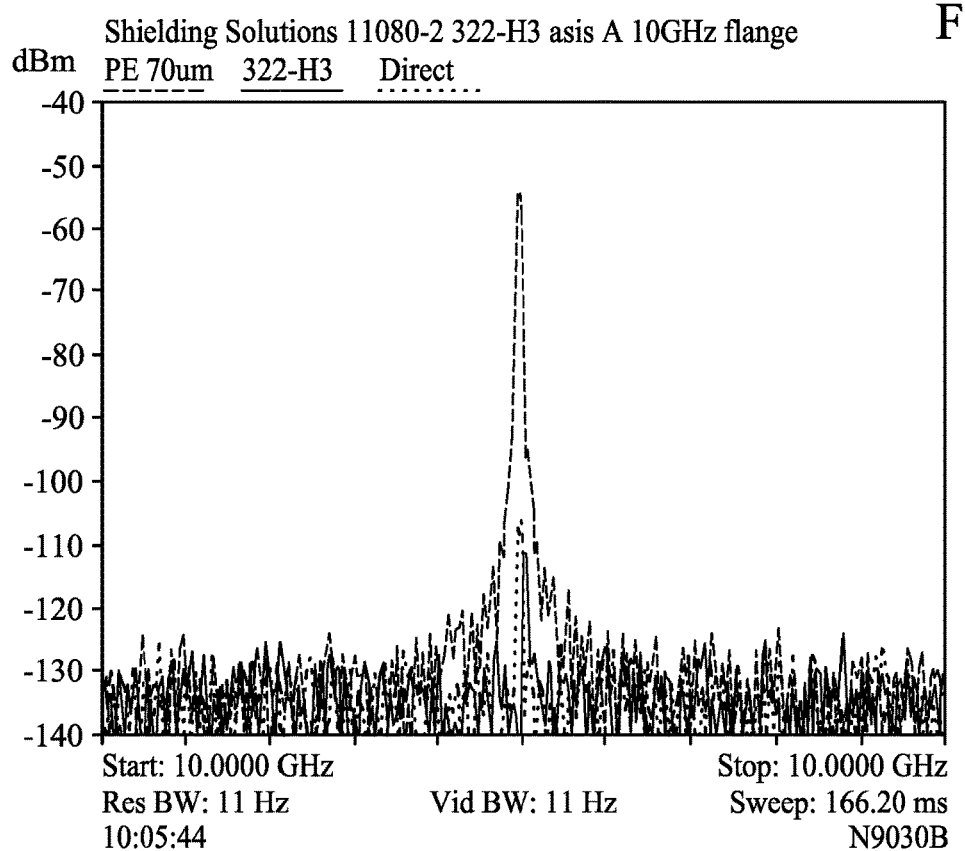
Figure 4:
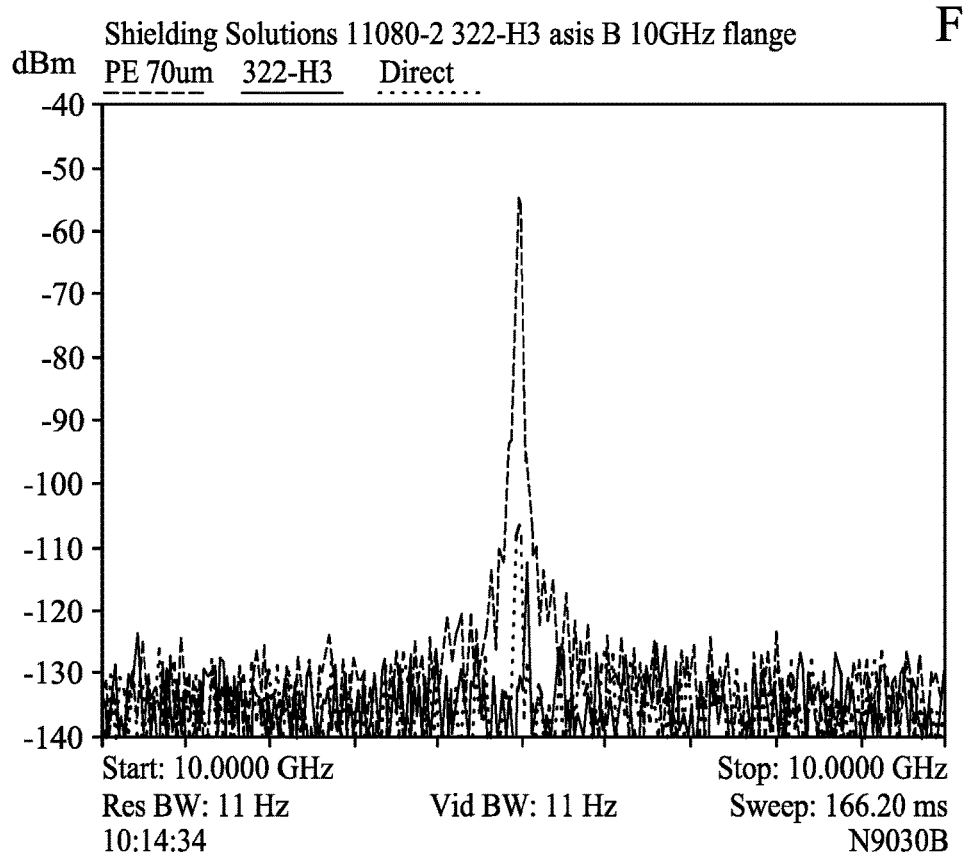
Figure 5:
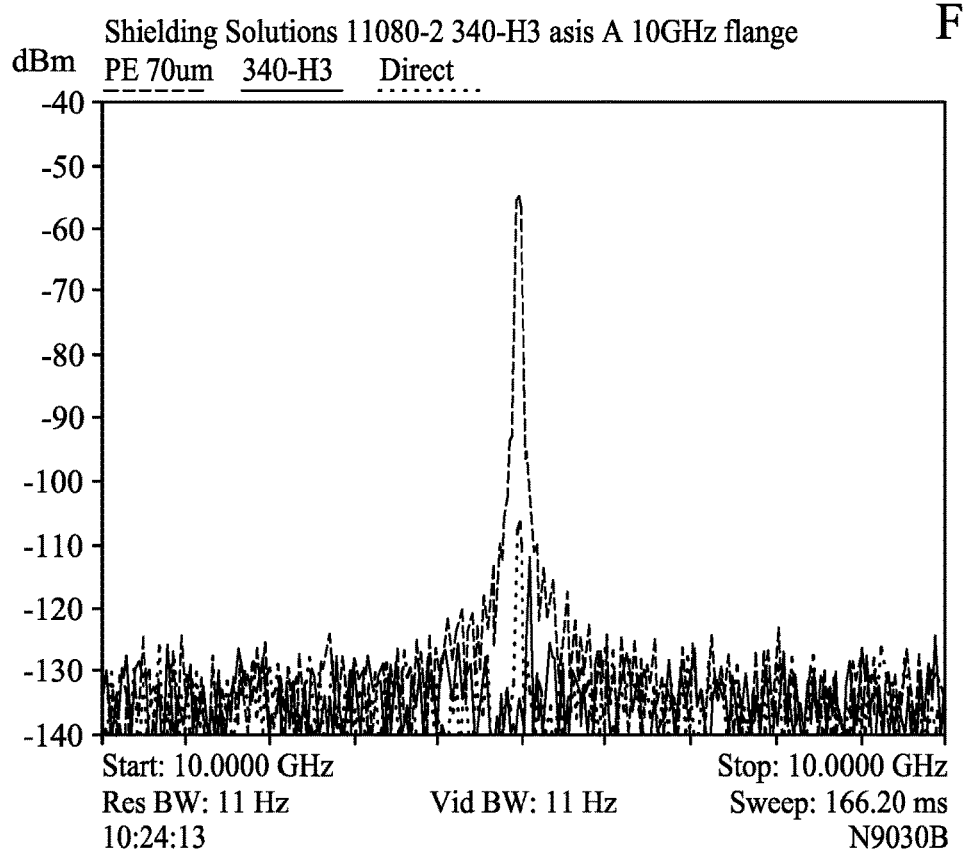
Figure 6:
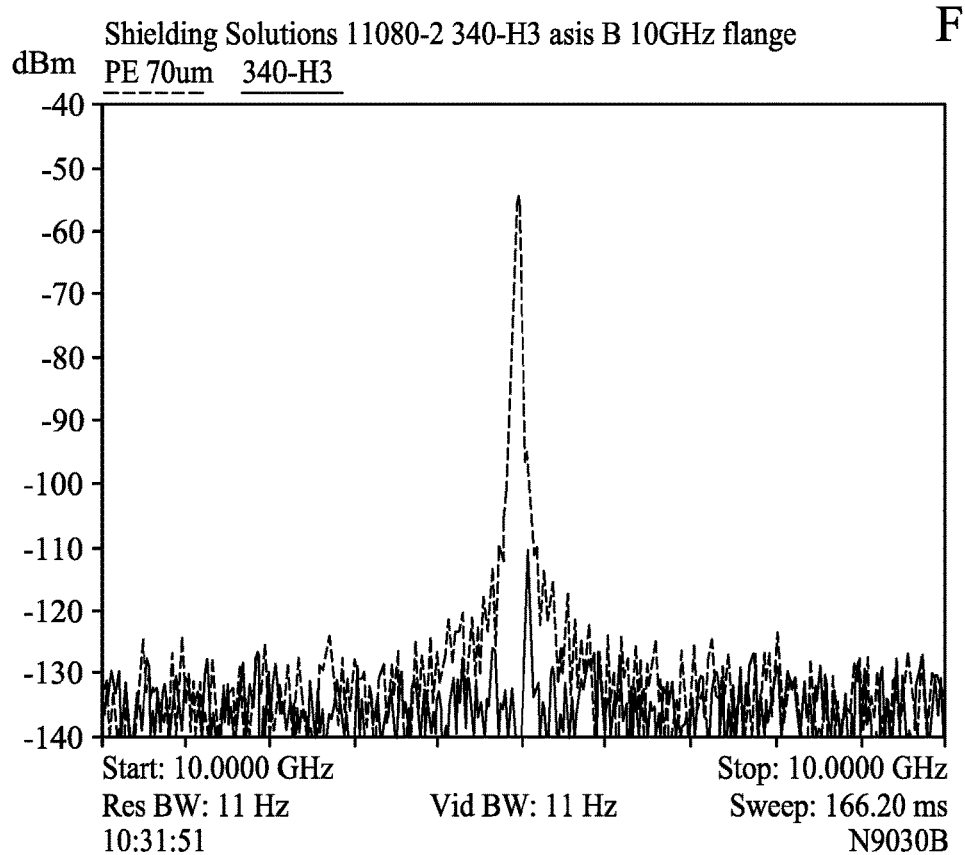
Figure 7:
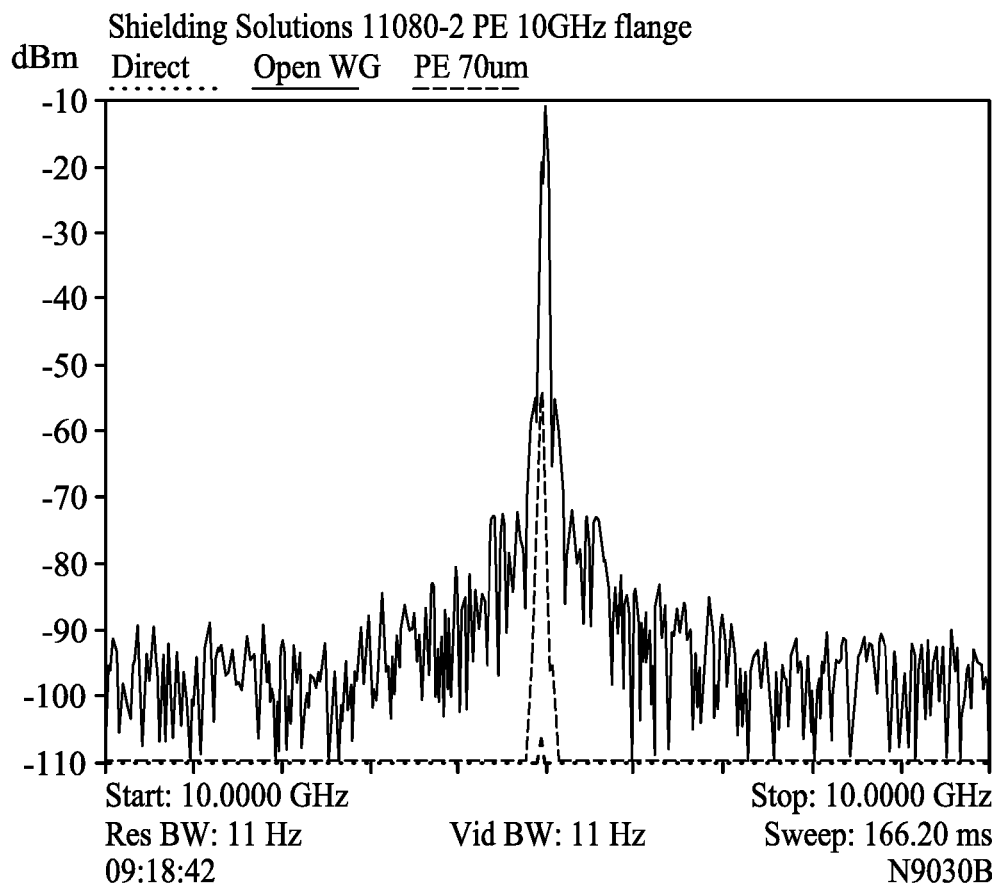
Figure 8:
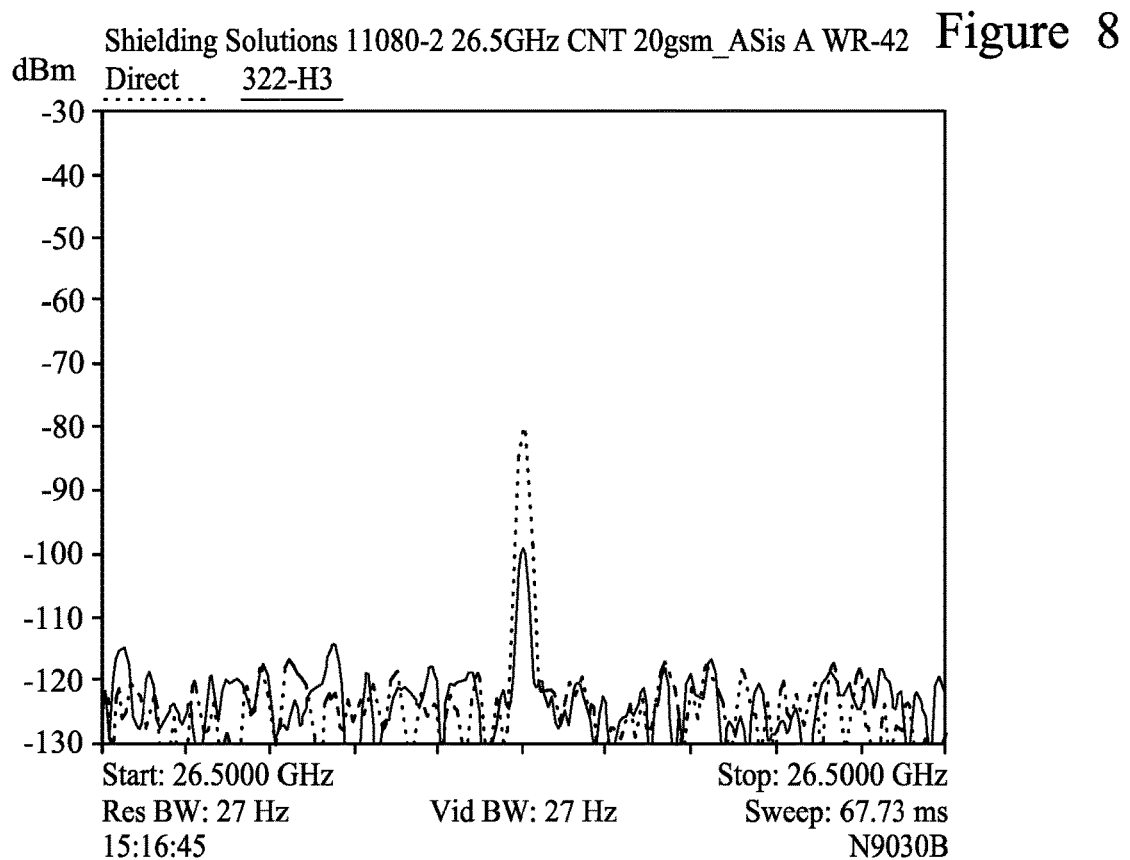
Figure 9:
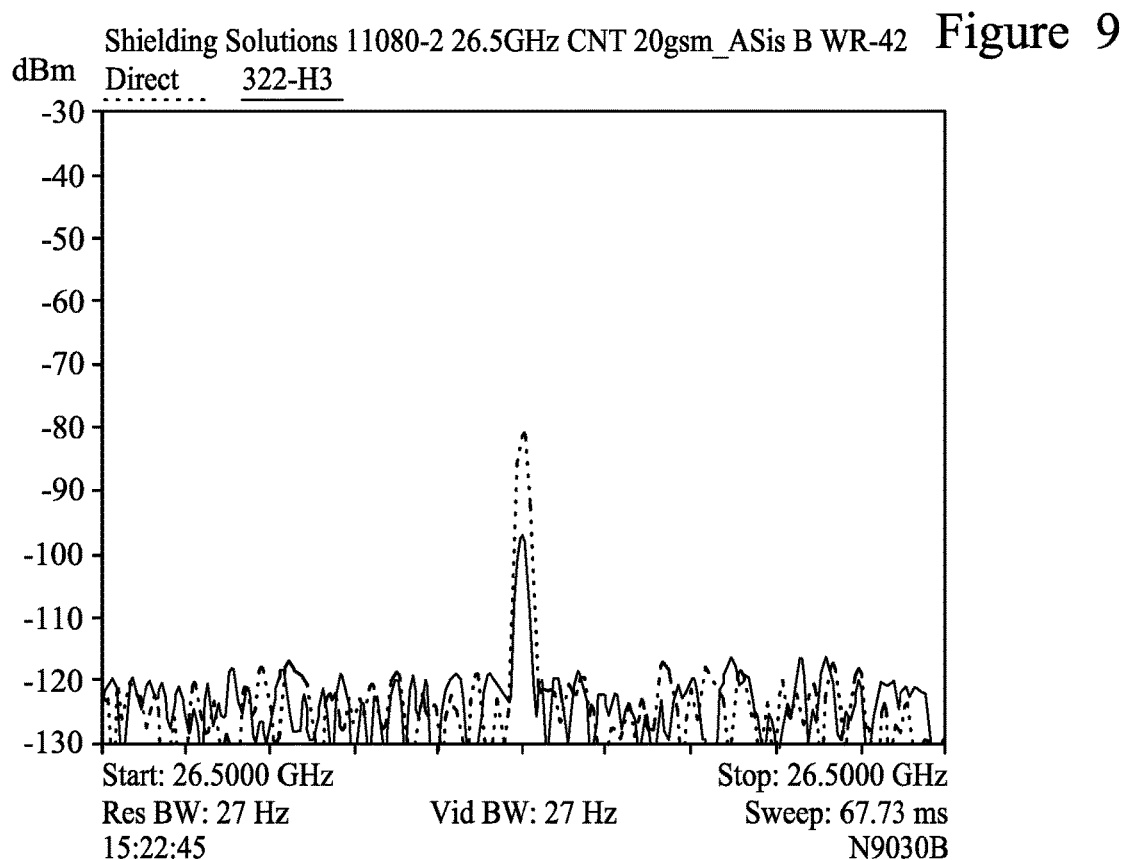
Figure 10:
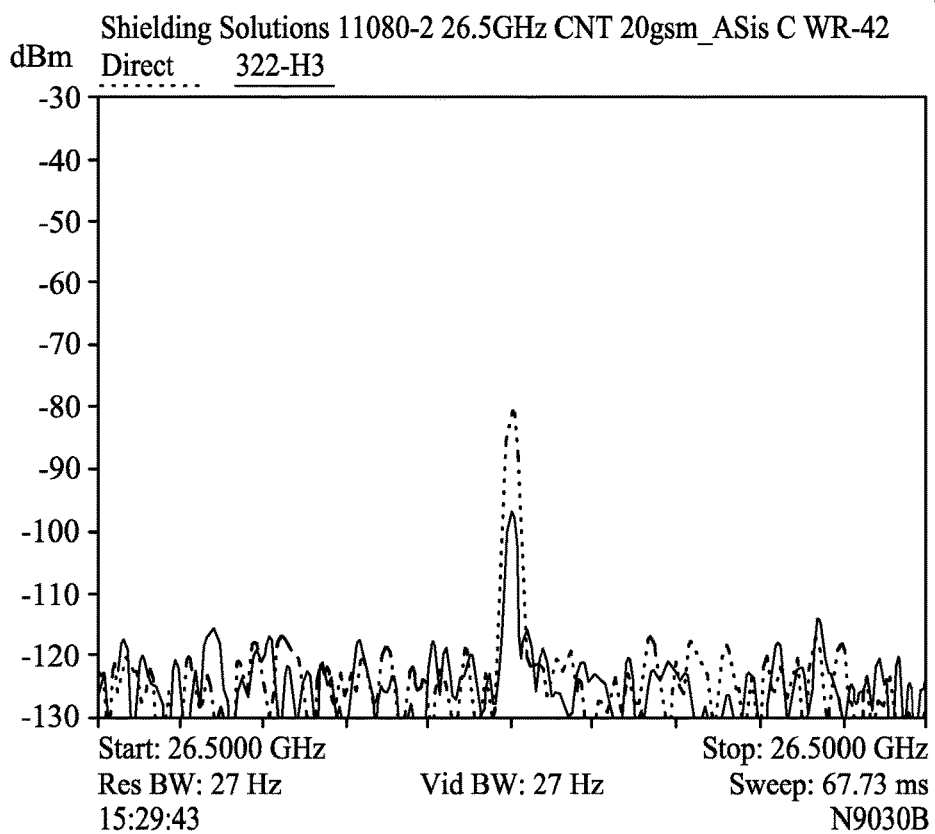
Figure 11:
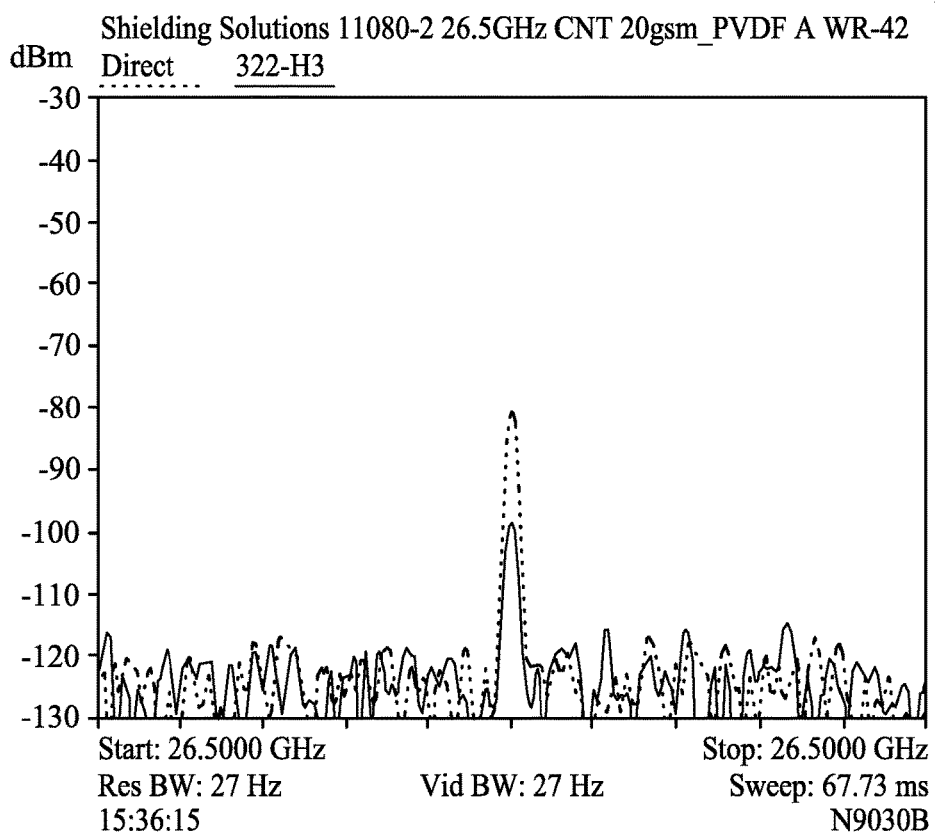
Figure 12:
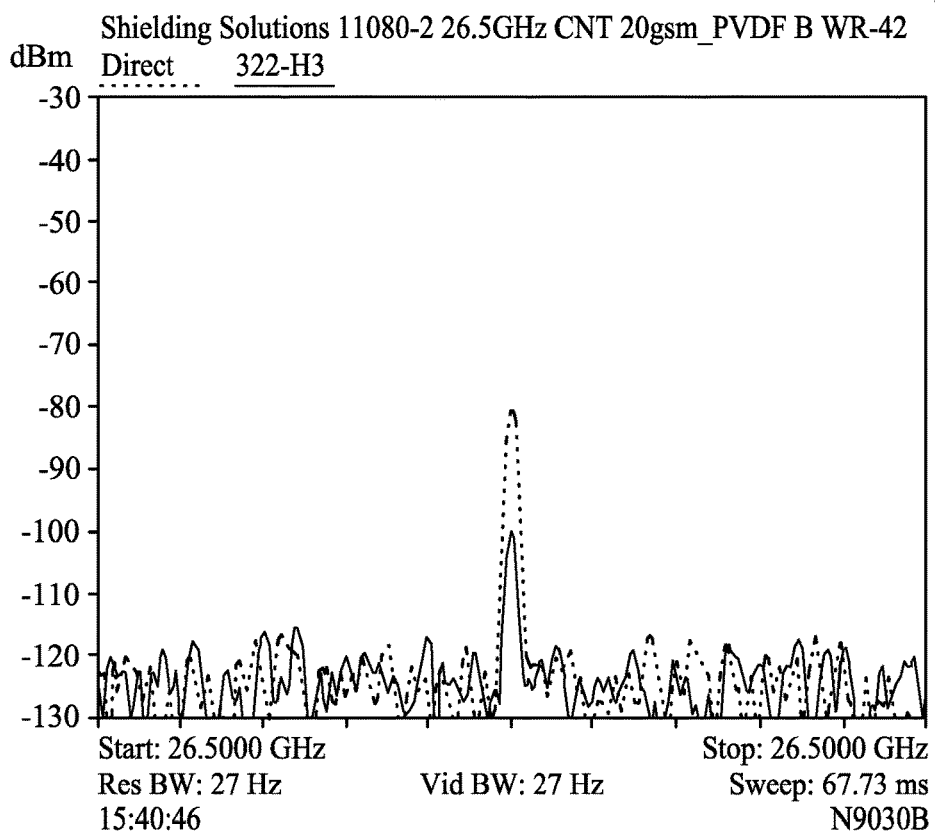
Figure 13:
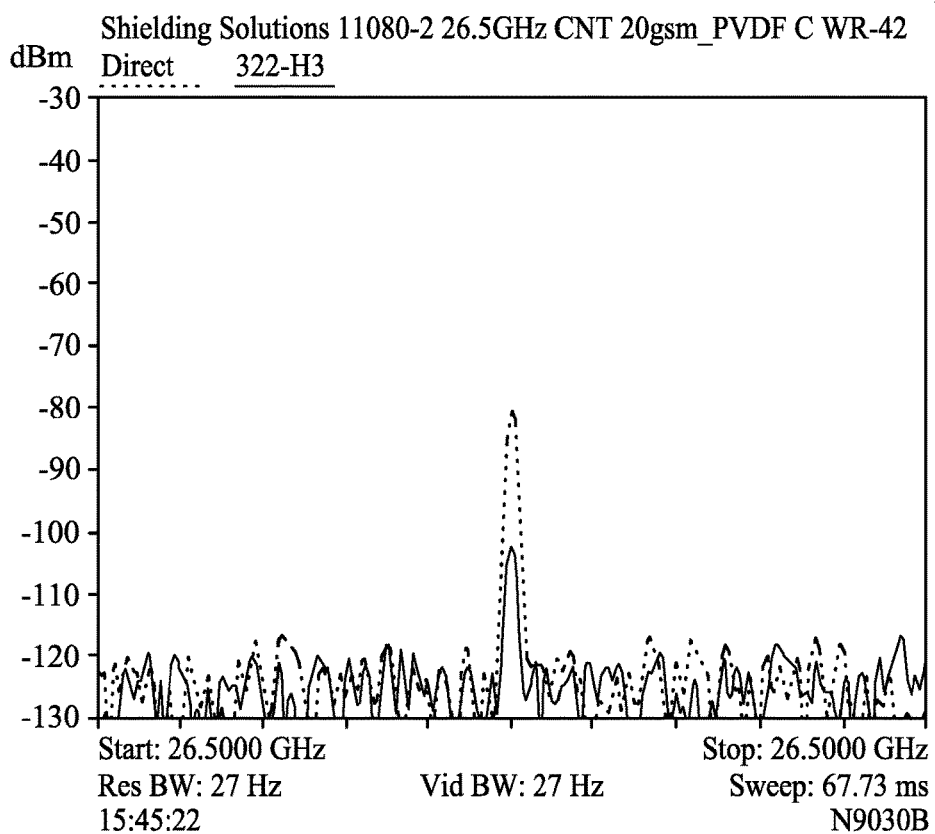
Figure 14:
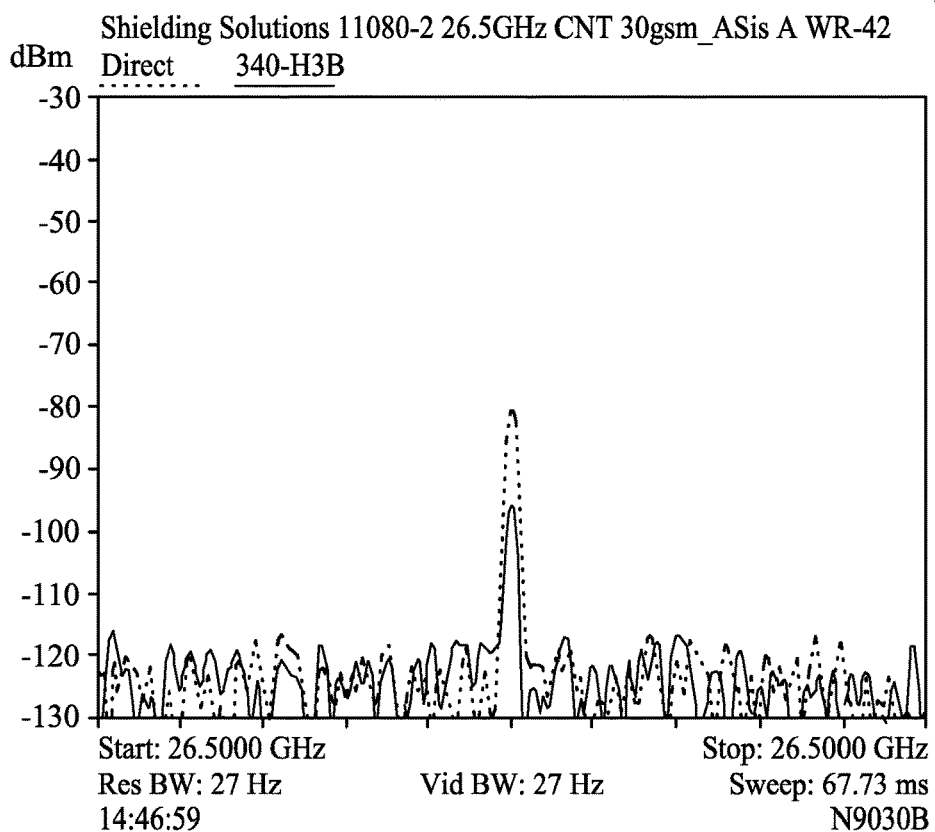
Figure 15:
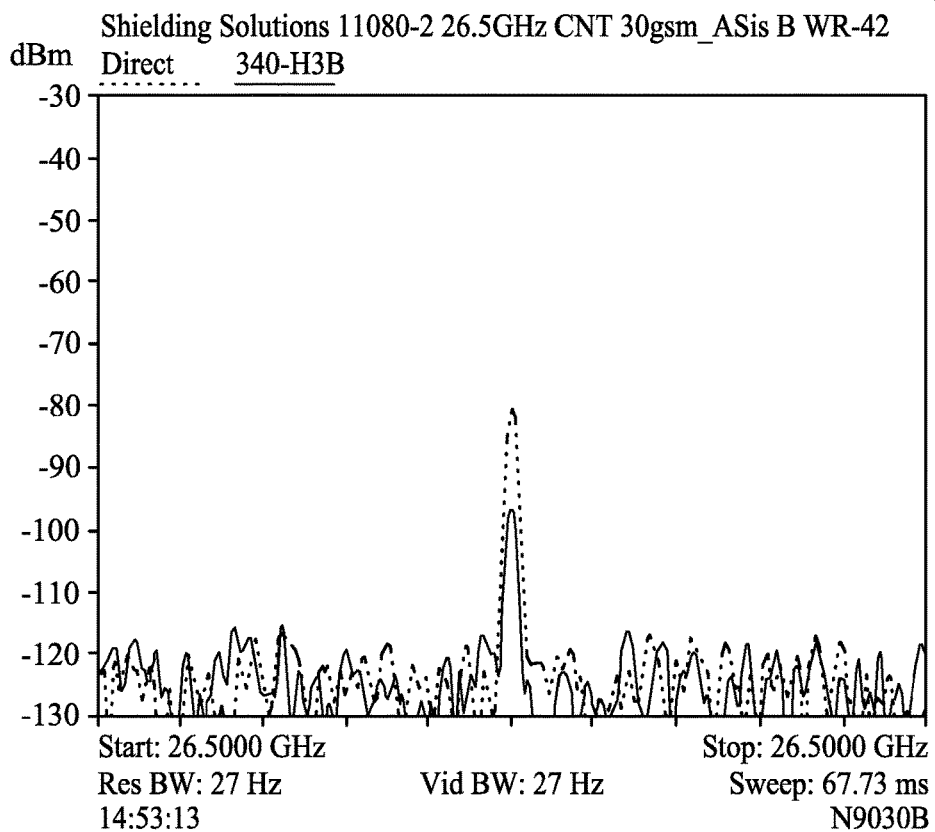
Figure 16:
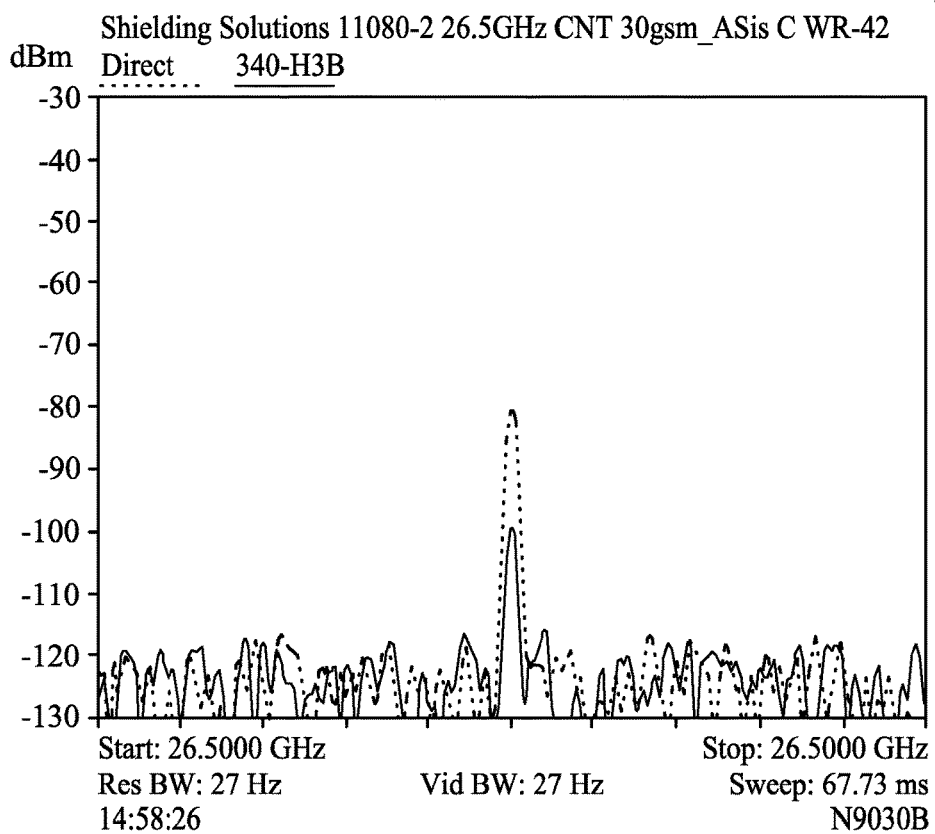
Figure 17:
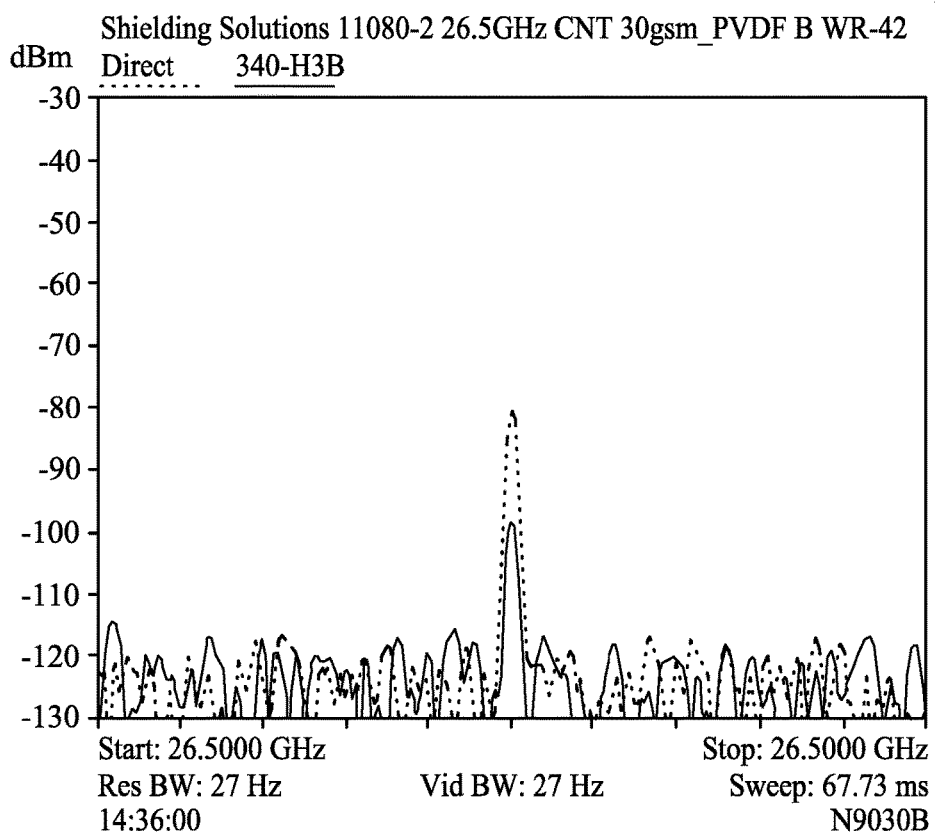
Figure 18:
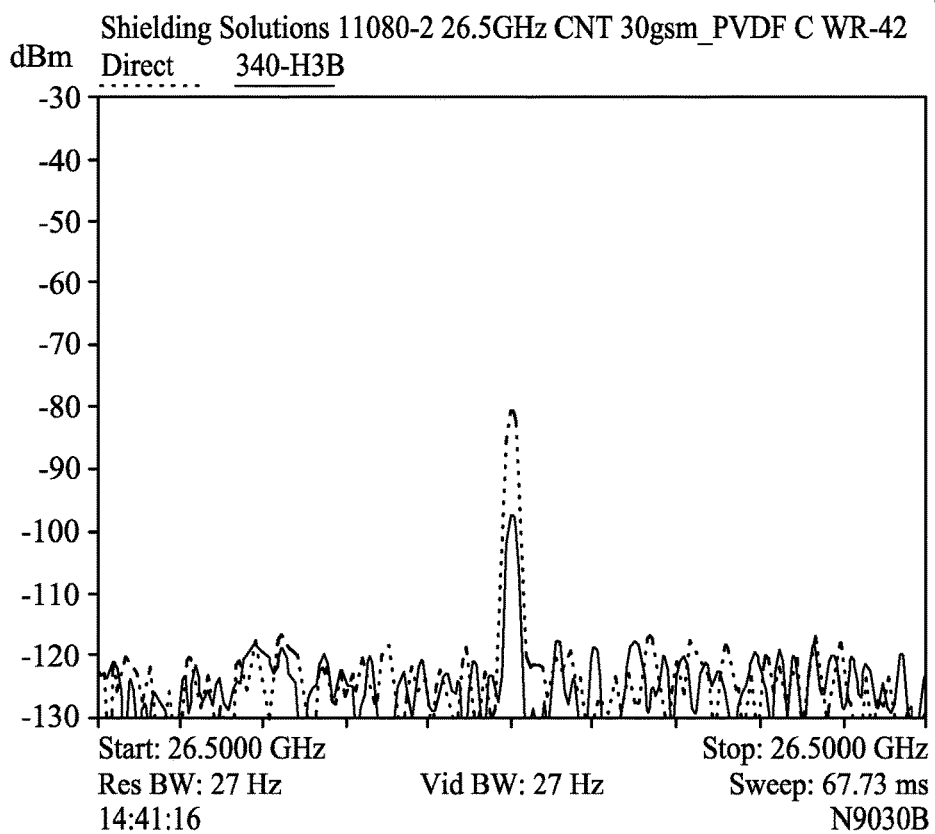
Figure 19:
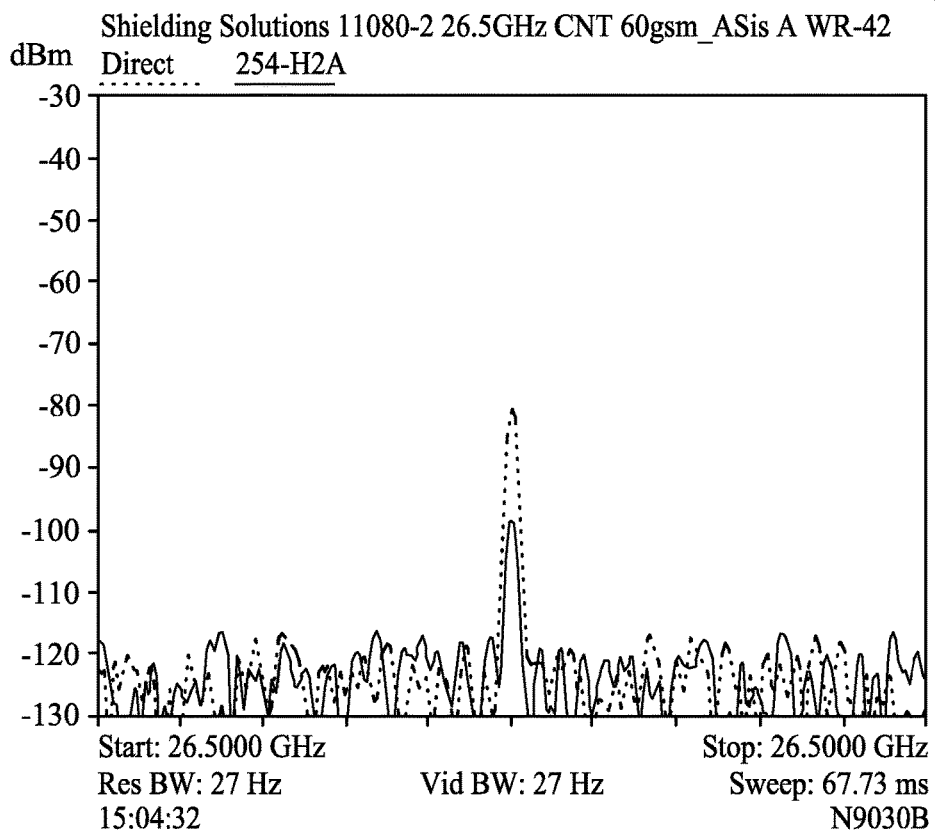
Figure 20:
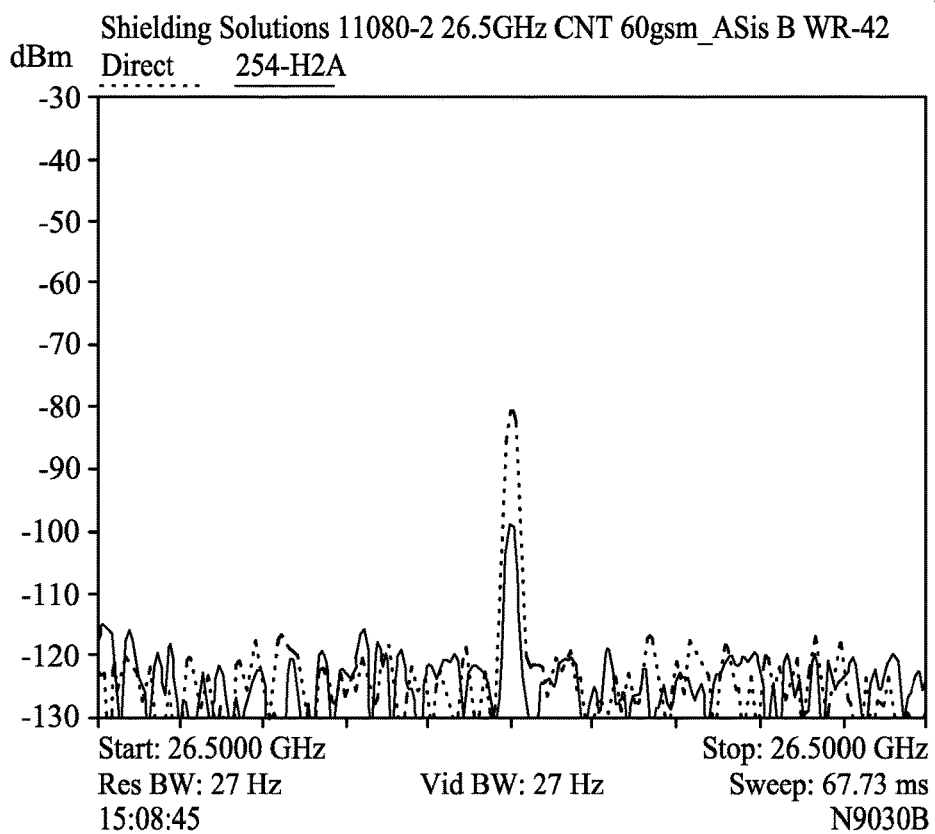
Figure 21:
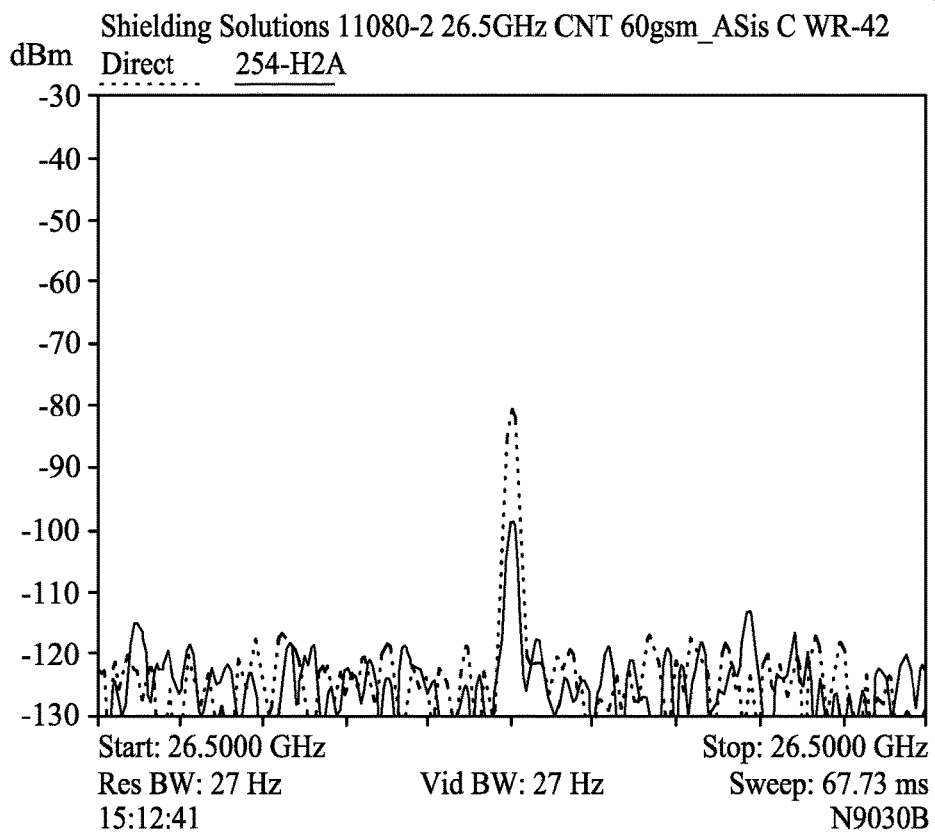
Figure 22:
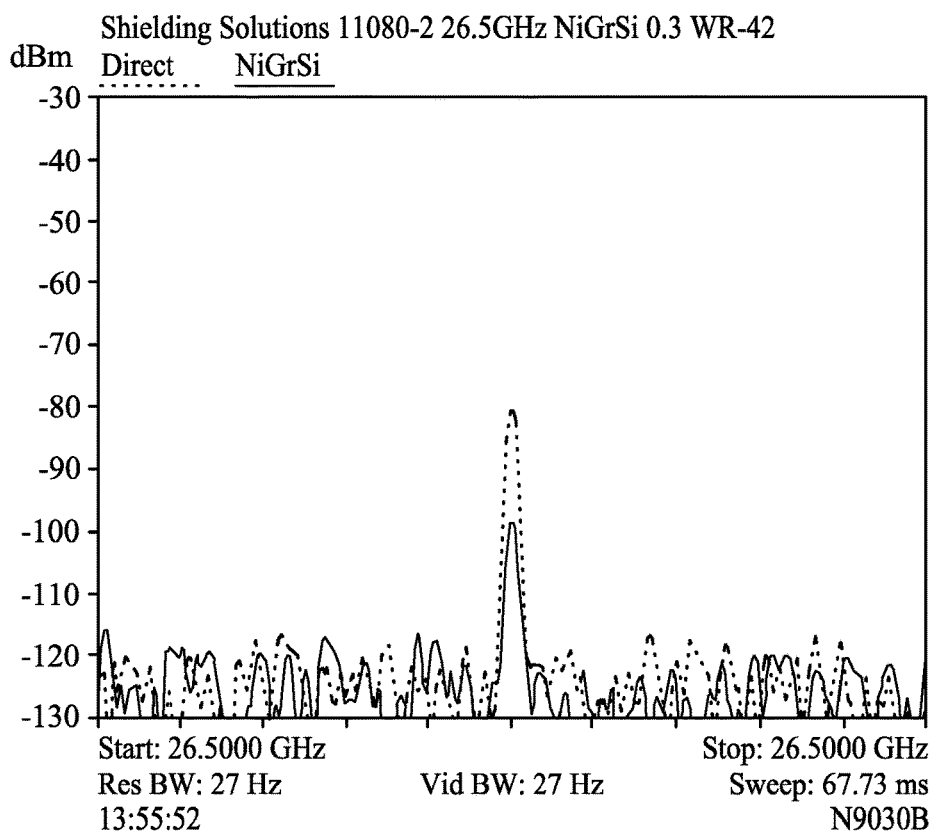
Figure 24:
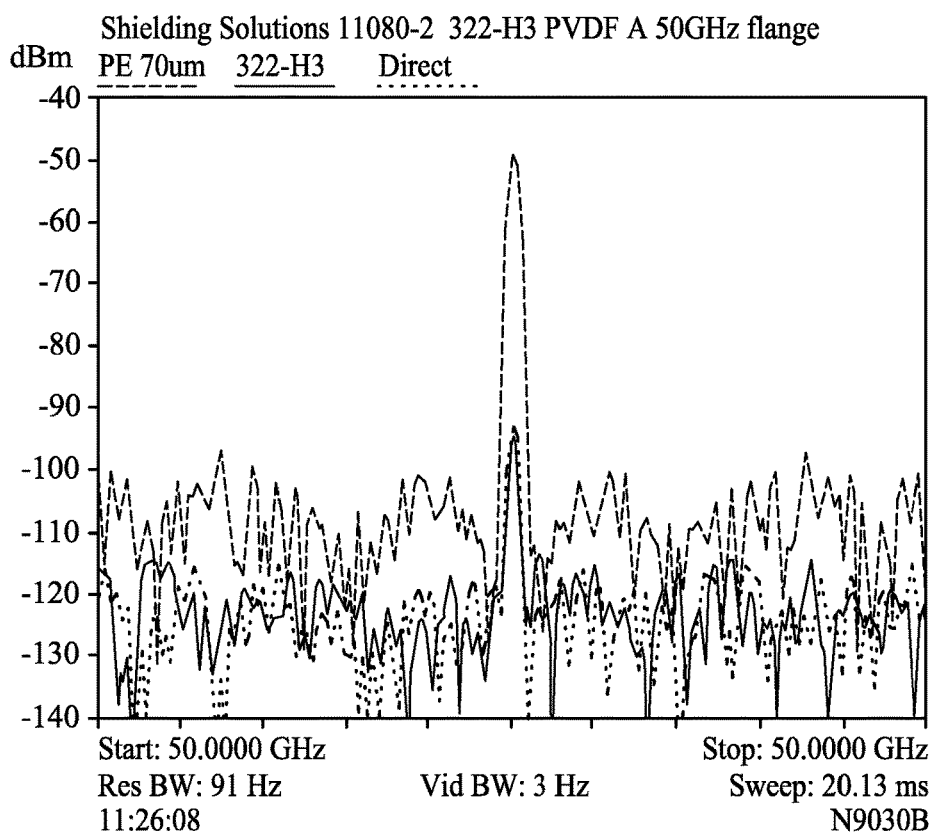
Figure 23:
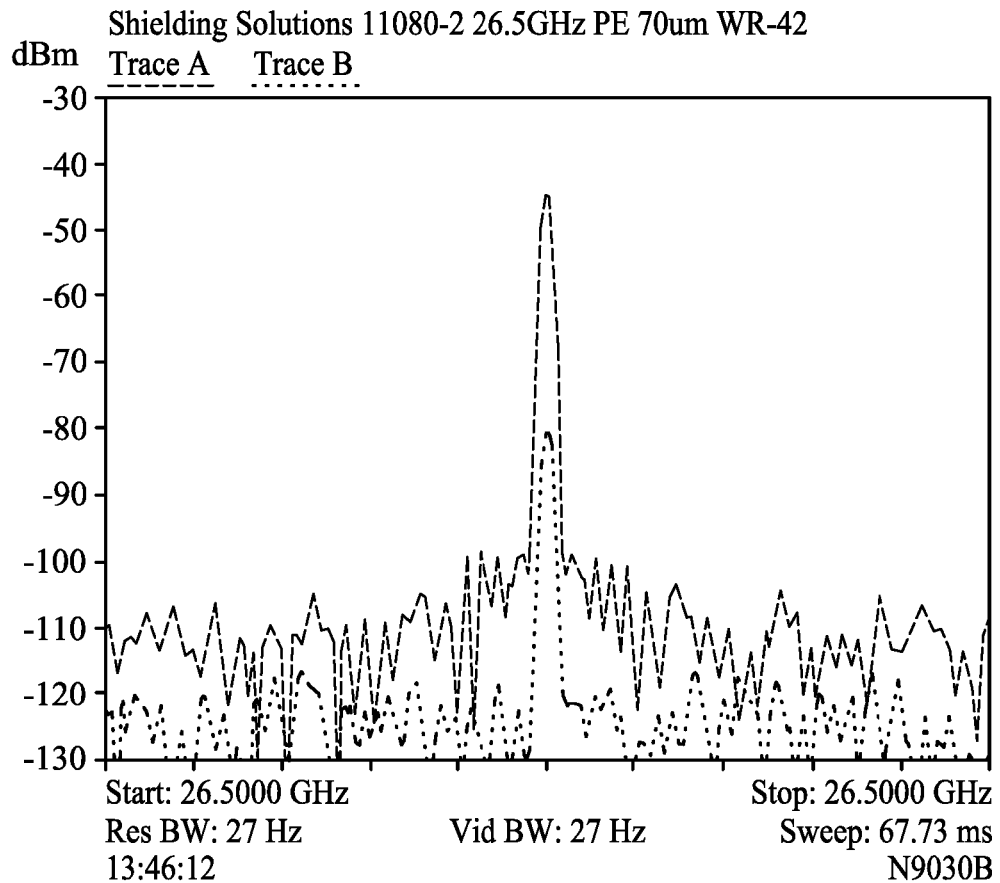
Figure 25:
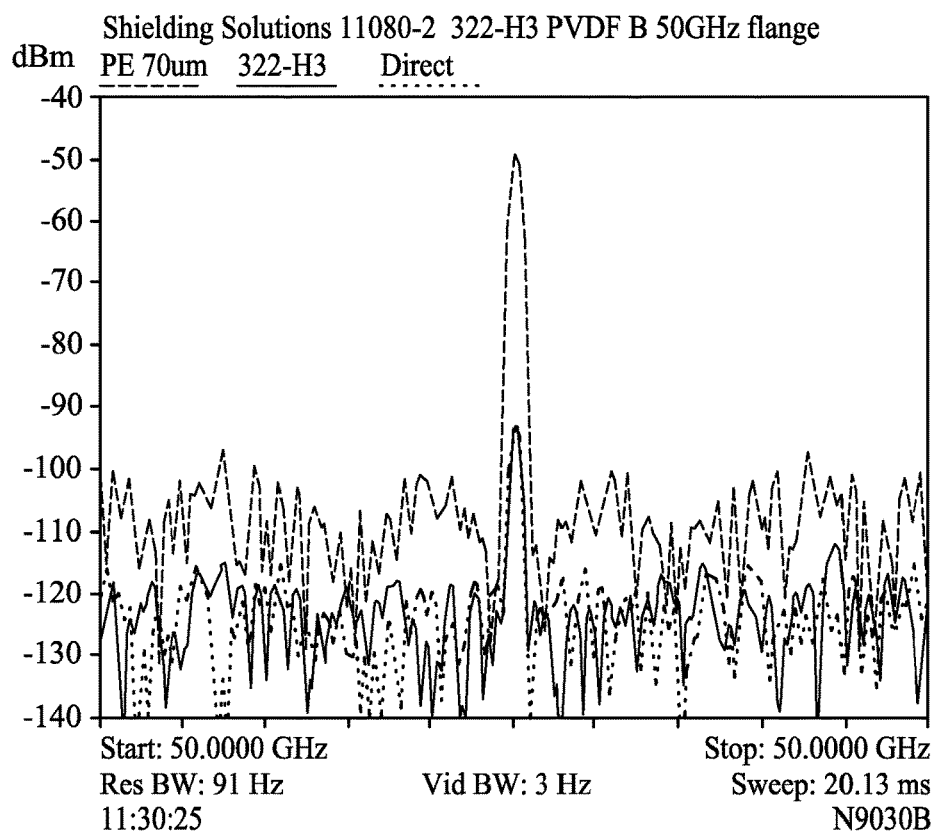
Figure 26:
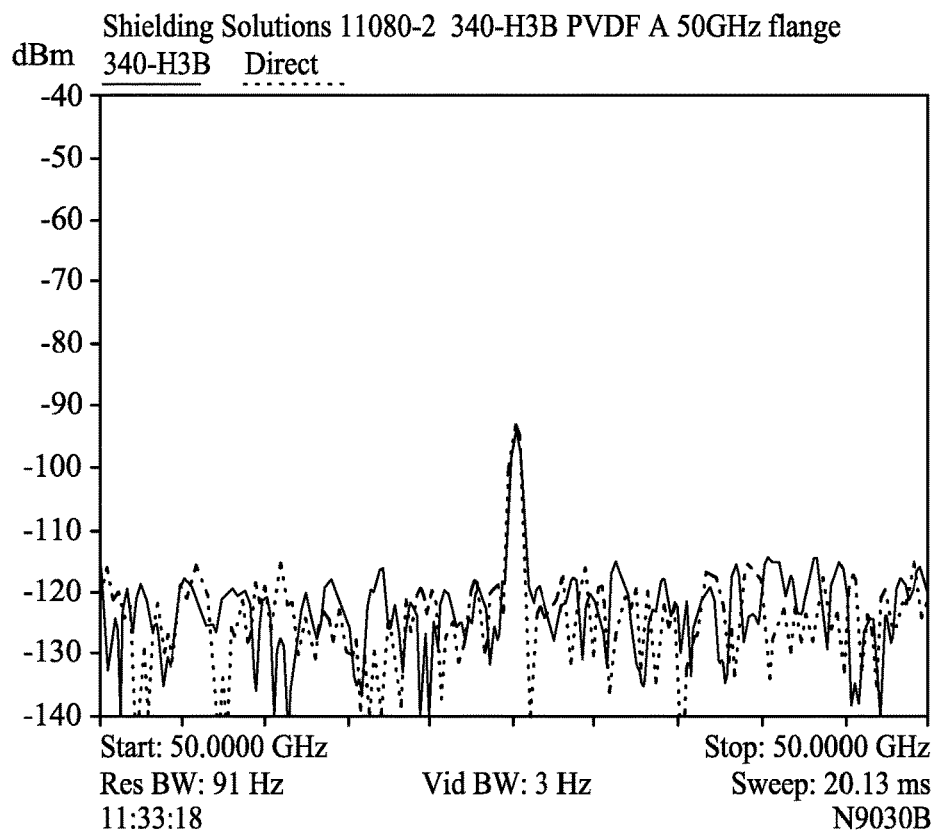
Figure 27:
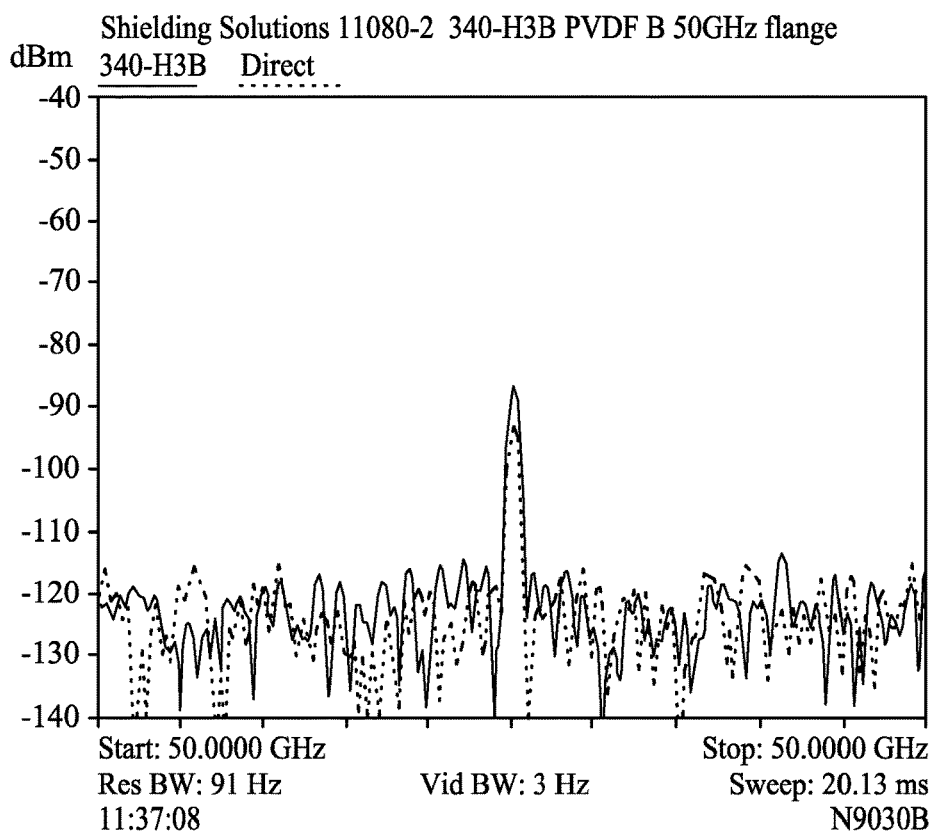
Figure 28:
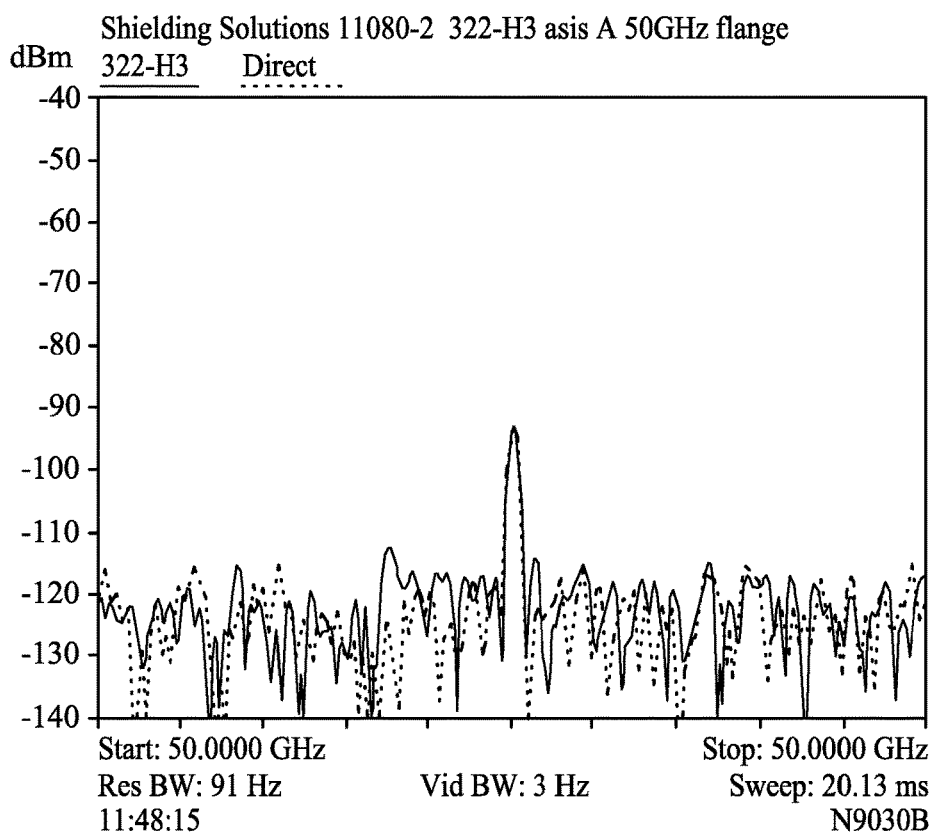
Figure 29:
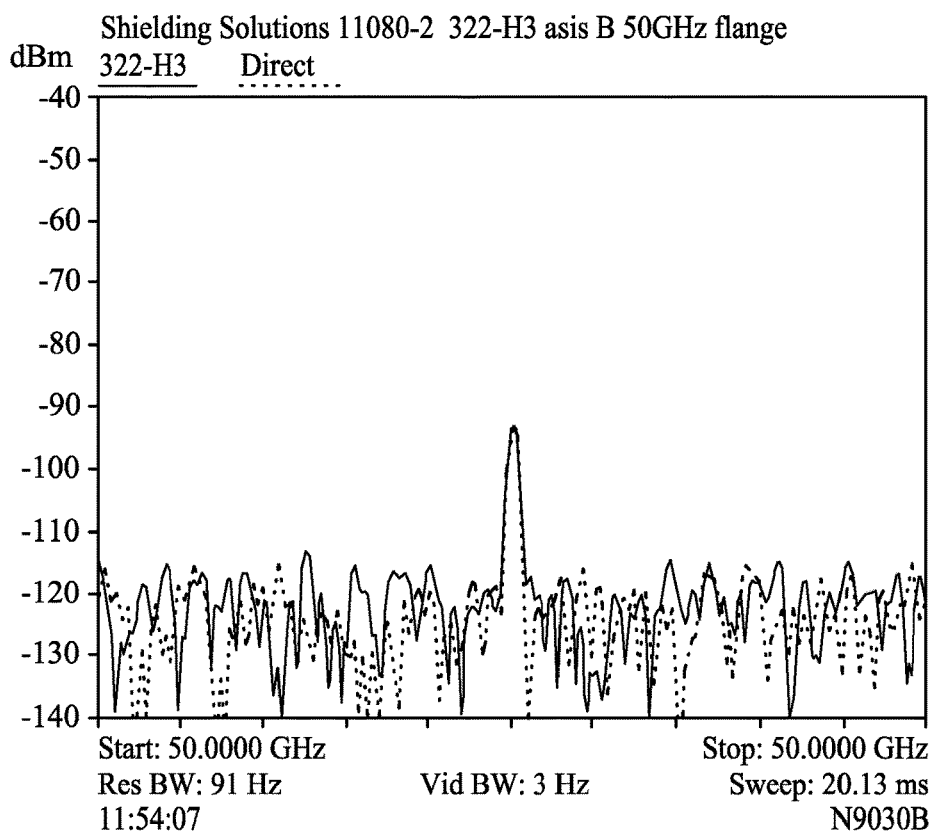
Figure 30:
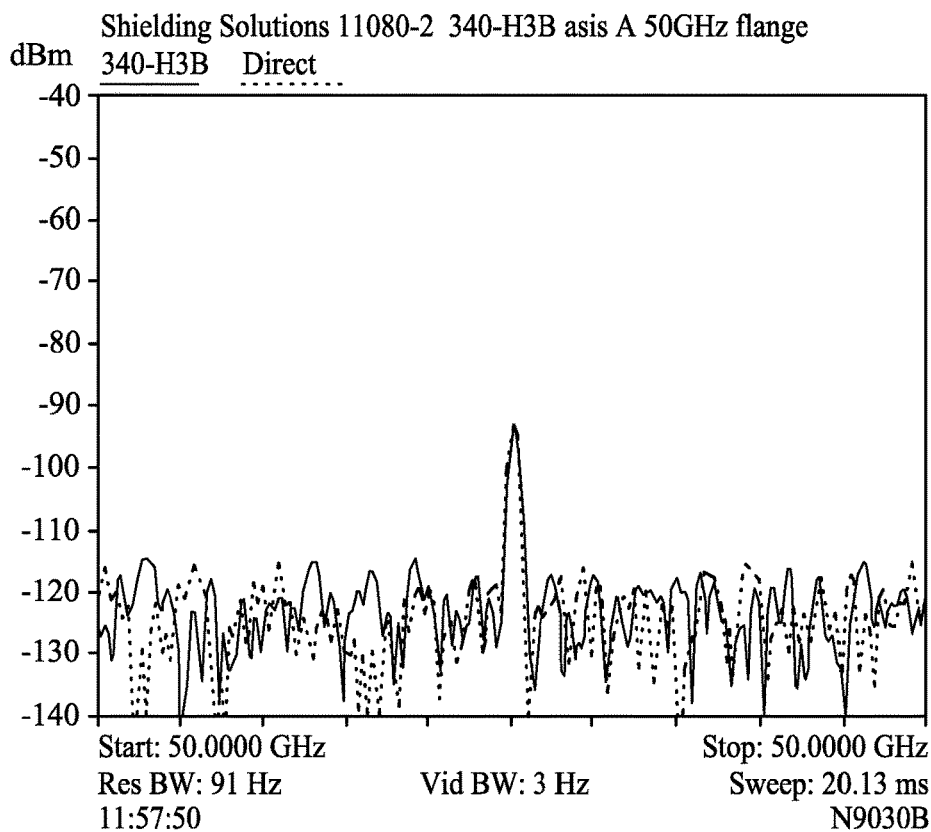
Figure 31:
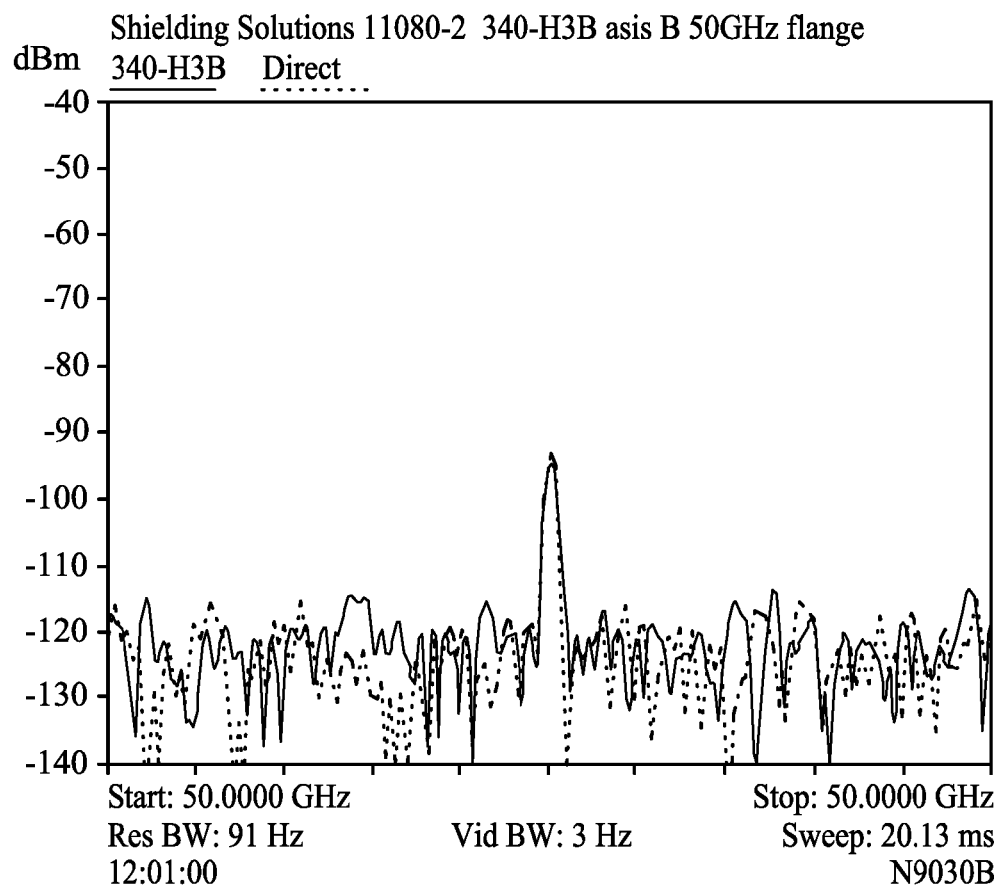
Figure 32:
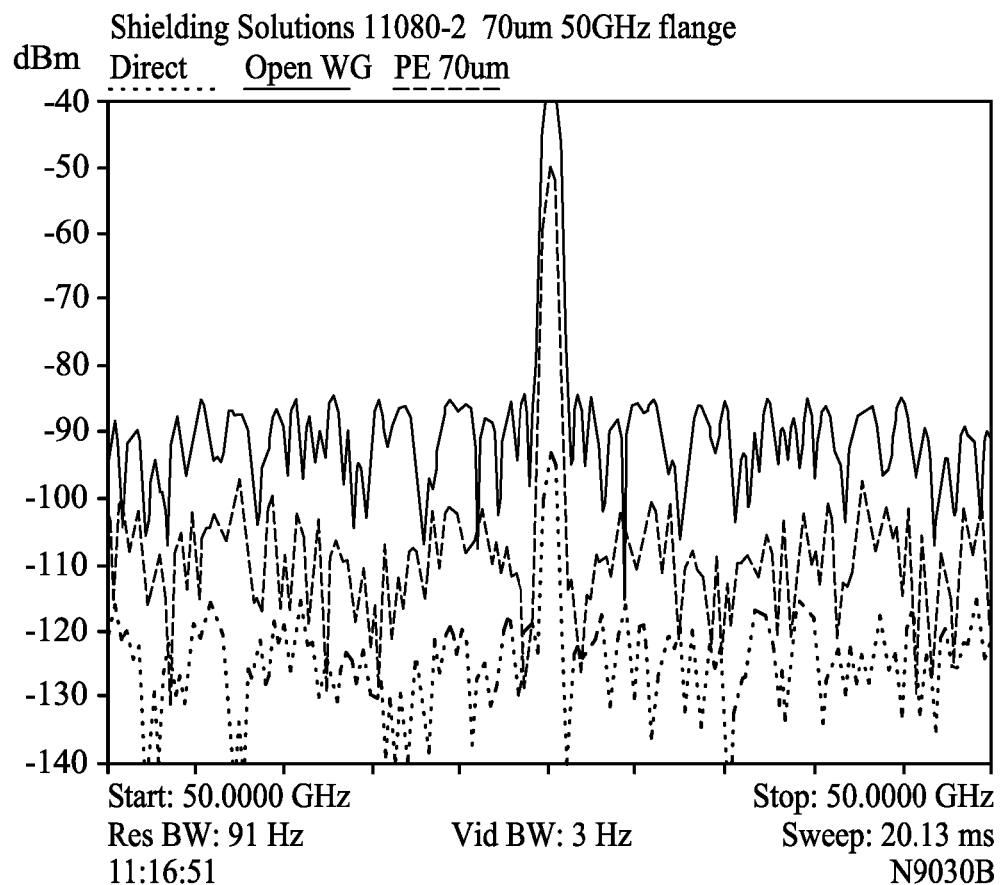

The shielding performance of representative embodiments of EMI shielding gaskets according to the invention was assessed at high frequency by measuring attenuation relative to free-space or to a polythene (PE) spacer.

Experimental

Measurements were made using a horn antenna positioned to the side of a waveguide flange at a fixed distance. A signal source produced a test signal. The following flanges (Flann Microwave Limited) and frequencies were used:
WR-112 10 GHz
WR-42 26.5 GHz
WR-19 50 GHz.

WR-112 is a choke flange which has a better performance metal-to-metal than a standard flange. For WR-112, the source was enclosed in a screen box.

For WR-42 and WR-19, the sources were in the waveguide.

The termination in each case was a waveguide load. The test method was based on IEEE Std 299: 2006 and the test equipment is listed in Table 1.

TABLE 1

| Item No. | Model No. | Description | Manufacturer |
|---|---|---|---|
| H058 | 861D | 40-60 GHz Horn Antenna 25 dBi | Alpha |
| E204 | 45821H | 26-40 GHz Horn Antenna 20 dBi | Hughes |
| E329 | 8349B | 2-20 GHz Amplifier | Agilent |
| E296-4 | 11970U | 40-60 GHz mixer | Agilent |
| E366 | WBH224S | 1.7-24 GHz horn antenna | Q-par |
| E777 | MG3695B | 50 GHz signal generator | Anritsu |
| E755 | N9030B | PXA Spectrum Analyser | Keysight |
| E853 | — | Cable 2.4/2.92 mm | |
| E933 | 321B | WR-112 Load | Narda Calstron |
| E934 | U910A | WR-42 load | Fmi |
| E935 | 2217 | WR-19 load | HP |
| H024 | ESG-0015 | 250 kHz-15 GHz Signal Generator | ERA Instruments |

The CNT materials used to prepare the EMI shielding gaskets of the invention are available from TorTech with the following catalogue numbers:
C-322-H3 20 gsm
C-340-H3B 30 gsm
C-254-H2A 60 gsm.

The CNT material was laser cut according to standard techniques to incorporate apertures and the desired configuration of the EMI shielding gasket. Tests were carried out on uncoated EMI shielding gaskets made from the CNT materials and on PVDF coated EMI shielding gaskets made from the CNT materials. The PVDF coated EMI shielding gaskets were prepared by dissolving PVDF pellets (Sigma Aldrich) in acetone (15% w/w) and applying the solution to the surface of an uncoated EMI shielding gasket. The acetone was allowed to evaporate to leave a PVDF coating.

A silicone elastomer containing nickel and graphite (CEM-NC001-0-0.3 80H 600 gsm) was used as a reference material.

Results

Attenuation plots are provided in FIGS. 1 to 32. For each of the waveguide types, the results are tabulated below. In the attenuation plots and Tables, the following abbreviations are used:
"PVDF" is a PVDF coated EMI shielding gasket
"ASIS" is an uncoated EMI shielding gasket
'Direct' is a waveguide with no gasket (ie metal-to-metal contact between waveguide flanges)
"PE70" is a polyethene spacer
"NiGrSi" is a gasket made from the reference material.

TABLE 2

| 10 GHz | | | | | |
|---|---|---|---|---|---|
| Open WG | PE70 | Direct | 322-H3 20 gsm PVDF A | 322-H3 20 gsm PVDF B | NiGrSi |
| −10.9 | −54.5 | −106.5 | −107.0 | −112.1 | −105.4 |
| | | 340-H3 30 gsm PVDF A | 340-H3 30 gsm PVDF B | 340-H3 30 gsm PVDF C | |
| | | −106.0 | −103.7 | −106.0 | |
| | | 322-H3 asis A | | 322-H3 asis B | |
| | | −107.0 | | −112.1 | |
| | | 340-H3 asis A | | 340-H3 asis B | |
| | | −112.2 | | −110.5 | |

TABLE 3

| 26.5 GHz | | | | | |
|---|---|---|---|---|---|
| Open WG | PE70 | Direct | 340-H3B 30 gsm PVDF A | 340-H3B 30 gsm PVDF B | 340-H3B 30 gsm PVDF C |
| −39.1 | −44.5 | −80.7 | −98.5 | −98.5 | −97.4 |
| | | | 340-H3B 30 gsm asis A | 340-H3B 30 gsm asis B | 340-H3B 30 gsm asis C |
| | | | −95.8 | −96.5 | −99.4 |
| | | | 254-H2A 60 gsm asis A | 254-H2A 60 gsm asis B | 254-H2A 60 gsm asis C |
| | | | −98.6 | −98.8 | −98.7 |
| | | | 322-H3B 20 gsm asis A | 322-H3B 20 gsm asis B | 322-H3B 20 gsm asis C |

TABLE 3-continued

| 26.5 GHz | | |
|---|---|---|
| −99.3 | −96.8 | |
| 322-H3B 20 gsm PVDF A | 322-H3B 20 gsm PVDF B | 322-H3B 20 gsm PVDF C |
| −98.6 | −100.1 | −102.5 |
| NiGrSi | | |
| −98.4 | | |

TABLE 4

| 50 GHz | | | | | | |
|---|---|---|---|---|---|---|
| Open WG | PE70 | Direct | 322-H3 20 gsm PVDF A | 322-H3 20 gsm PVDF B | 322-H3 20 gsm asis A | 322-H3 20 gsm asis B |
| −32.8 | −49.4 | −93.6 | −94.7 | −93.0 | −93.0 | −93.0 |
| NiGrSi | | 340-H3 30 gsm PVDF A | 340-H3 30 gsm PVDF B | 340-H3 30 gsm asis A | 340-H3 30 gsm asis B | |
| −93.0 | | −93.9 | −86.7 | −94.0 | −93.4 | |

Conclusions

The results indicate generally that EMI shielding gaskets made from the CNT materials provide an improvement in attenuation over those made from the reference material. The gasket made from the CNT material with the lowest areal density (20 gsm) was surprisingly better than the EMI shielding gaskets made from the other CNT materials (30 gsm and 60 gsm). The PVDF coated EMI shielding gaskets unexpectedly outperformed the other gaskets.

EXAMPLE 2

Various properties of coated CNT material were measured using standard techniques.

Figure 33:
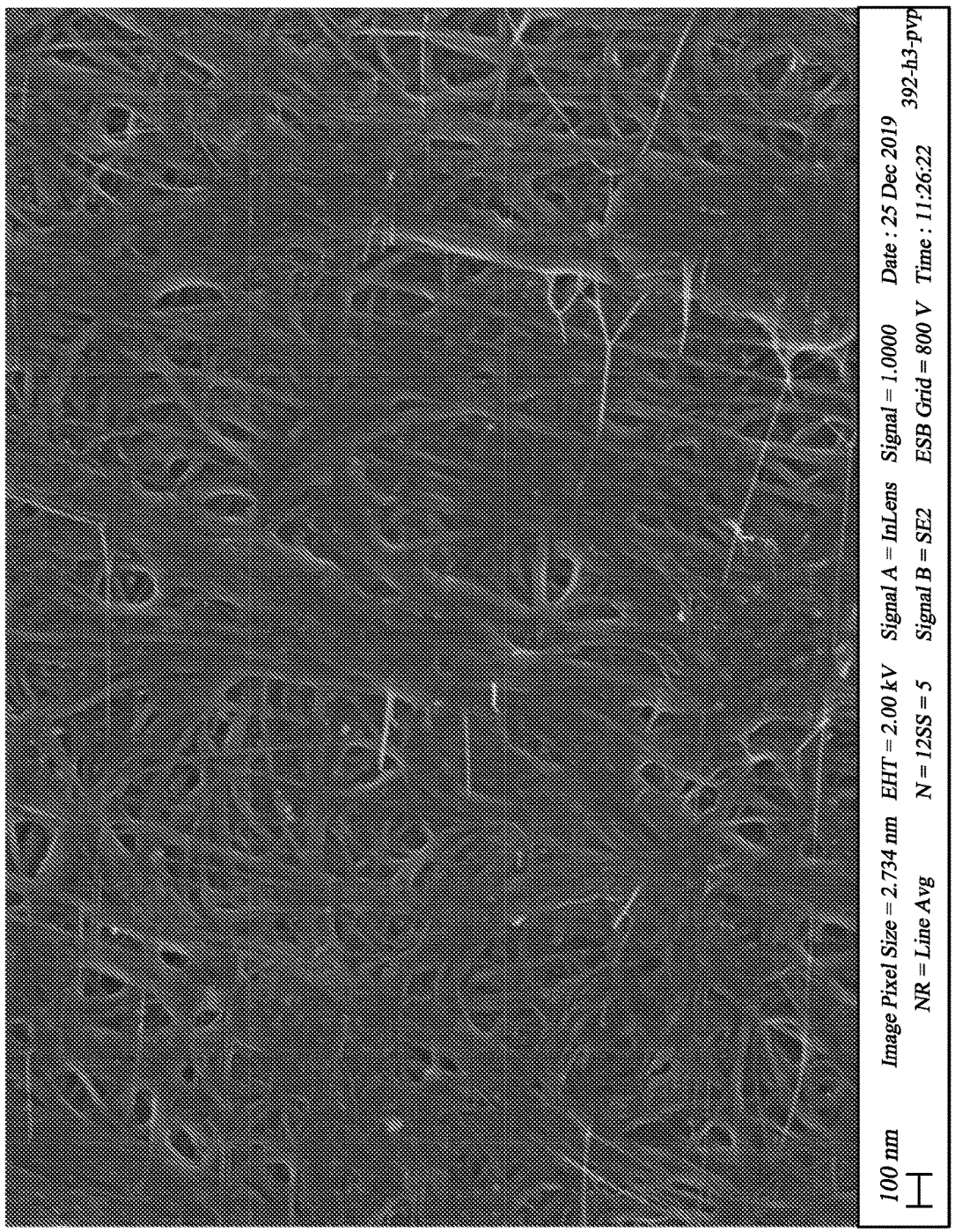
FIGS. 33 and 34 show SEM images of uncoated and coated CNT materials.
Figure 34:
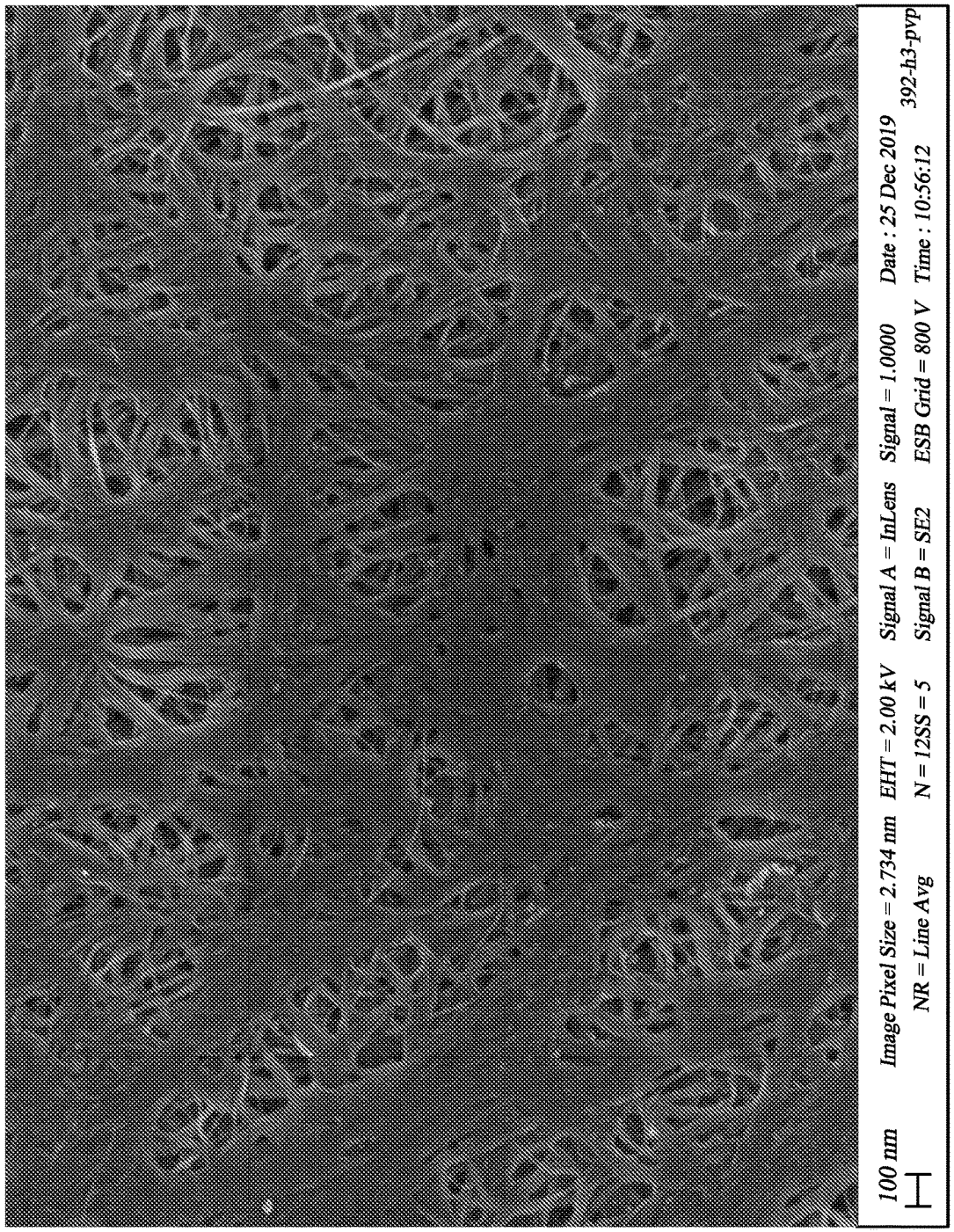
Figure 35:
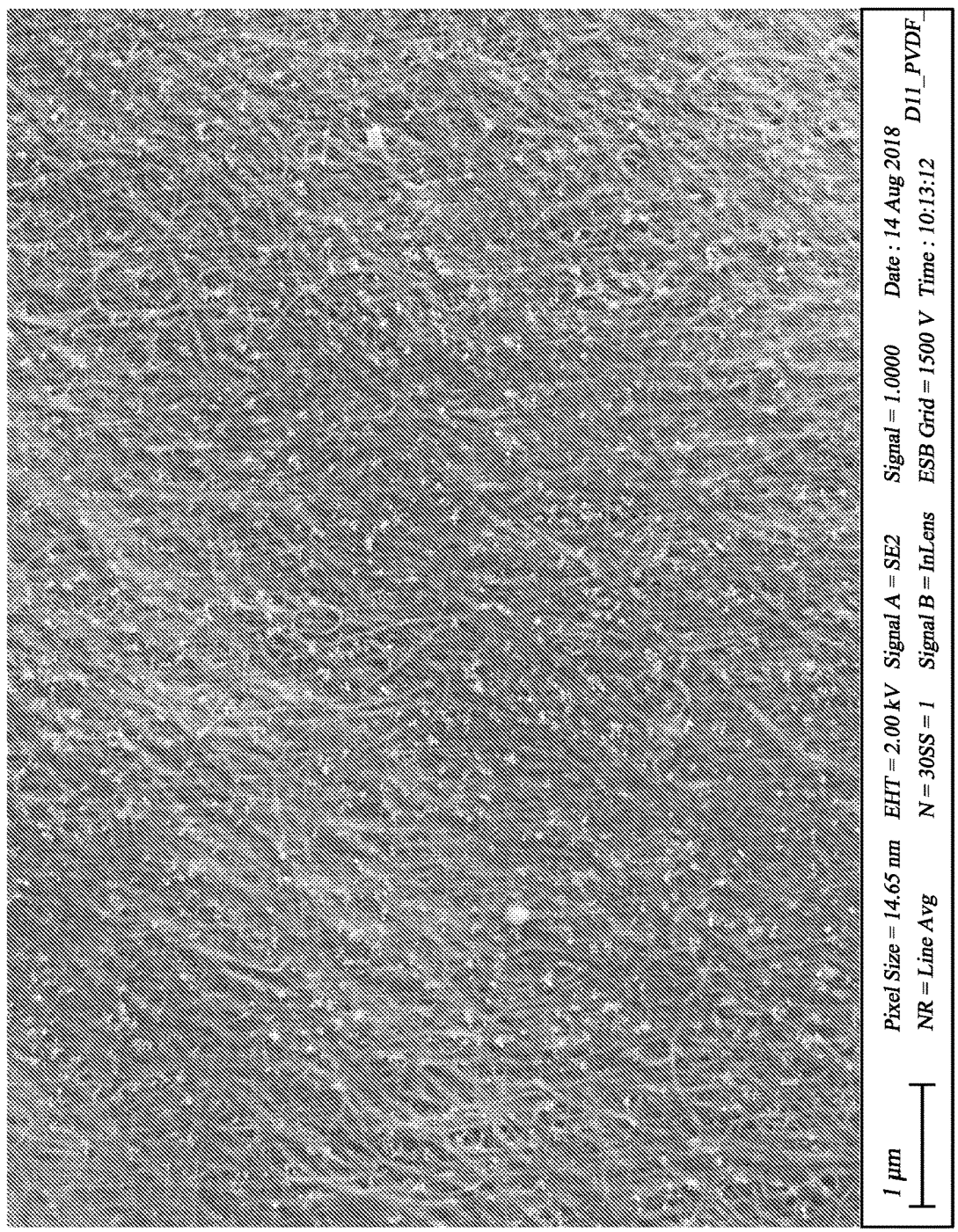

FIGS. 33 and 34 show respectively an SEM image of each face of a CNT material (20 gsm) coated with PVP. FIG. 35 shows an SEM image of a CNT material coated with 10 wt % PVDF.

Figure 36:
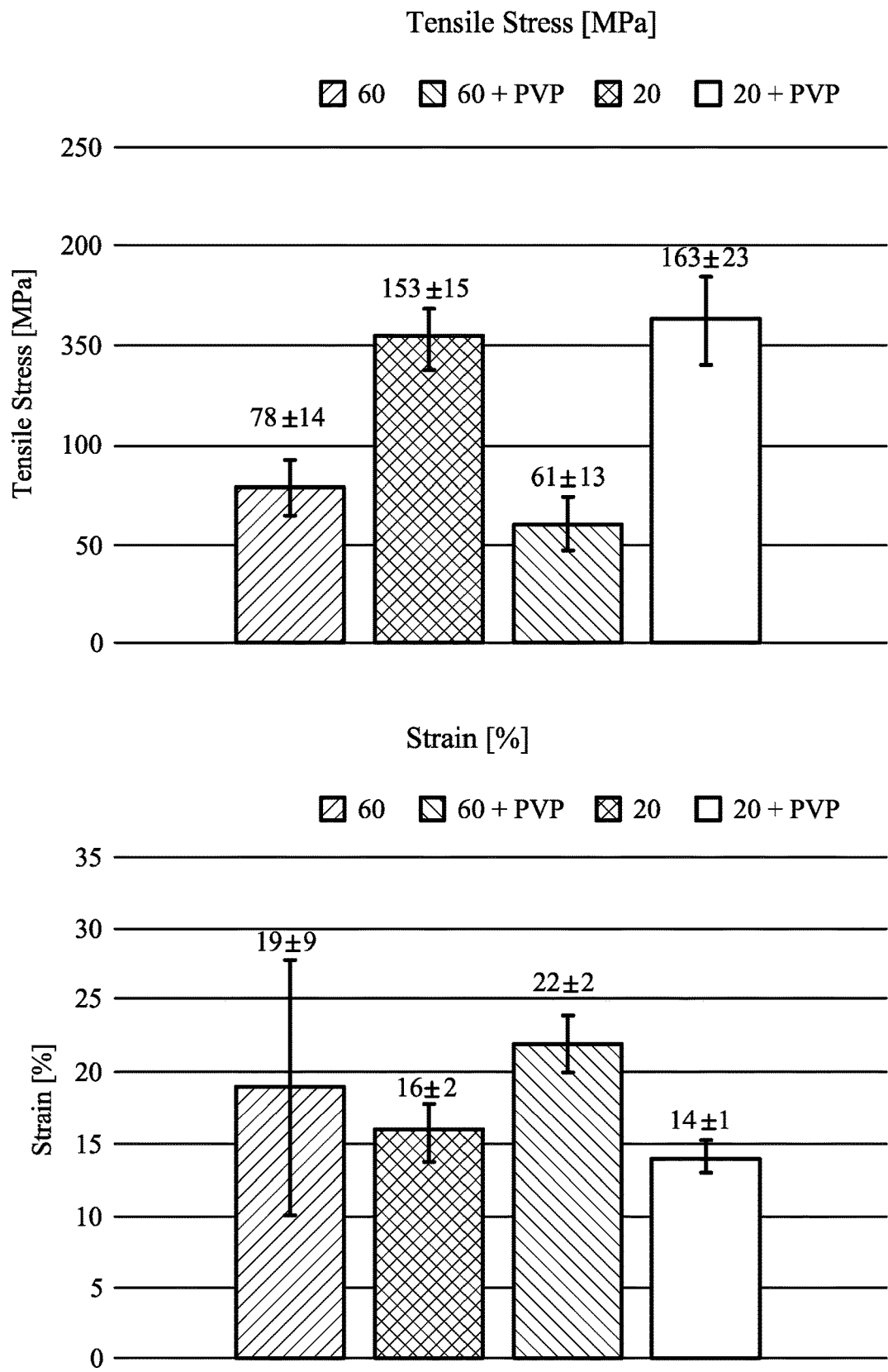
FIG. 36 shows a comparison of tensile stress and strain (%) for uncoated and coated CNT materials.

FIG. 36 shows a comparison of tensile stress and strain (%) for an uncoated CNT material (60 gsm), a CNT material (60 gsm) coated with PVP, an uncoated CNT material (20 gsm) and a CNT material (20 gsm) coated with PVP.

Figure 37:
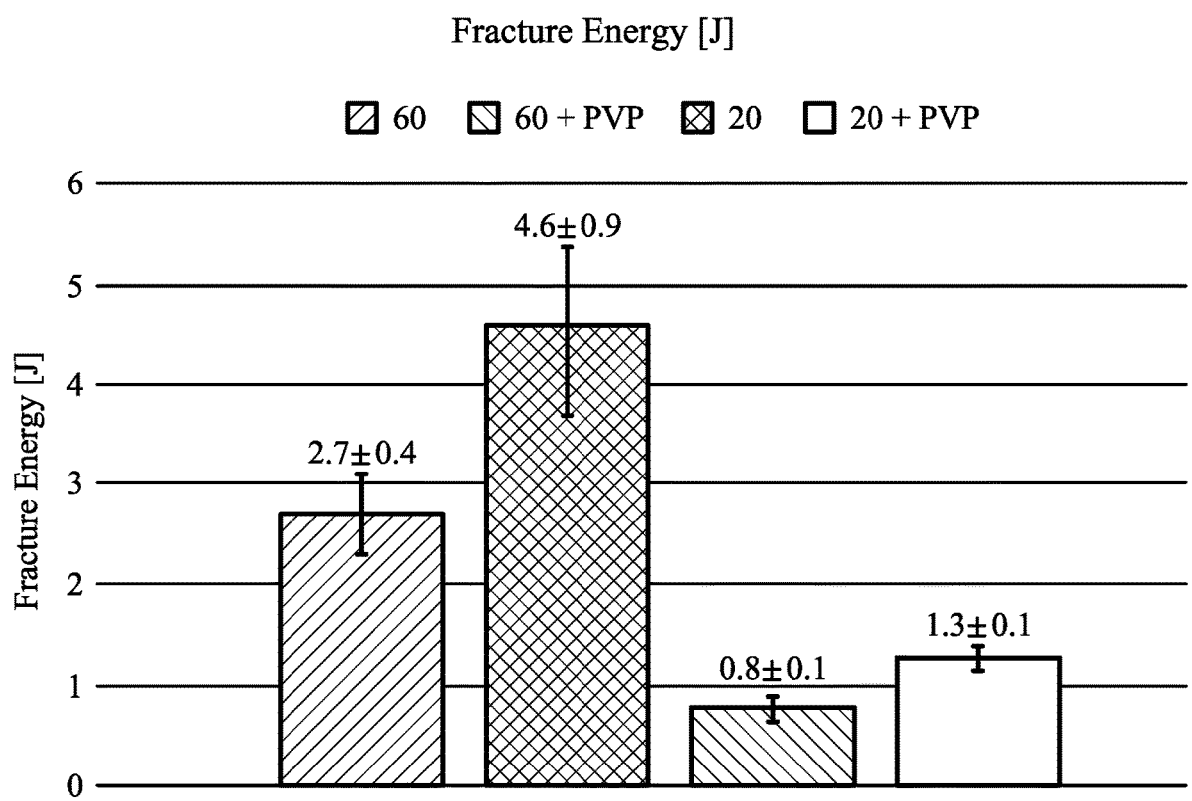
FIG. 37 shows a comparison of fracture energy for uncoated and coated CNT materials.

FIG. 37 shows a comparison of fracture energy for the uncoated CNT material (60 gsm), the CNT material (60 gsm) coated with PVP, the uncoated CNT material (20 gsm) and the CNT material (20 gsm) coated with PVP.

EXAMPLE 3

Experimental

The test equipment used for measurement is as follows:

| RN No. | Model No. | Description | Manufacturer |
|---|---|---|---|
| E366 | WBH224S | 1.7-24 GHz Horn Antenna | Qpar |
| E777 | MG3695B | 50 GHz Signal Generator | Anritsu |
| H301 | 45821H | 24-40 GHz Horn Antenna | Hughes |
| H302 | DP241 | 6-40(50)GHz DP Horn | Fmi |
| H304 | 83050A | 2 GHz-50 GHz amplifier | Agilent |
| H305 | 87421A | power Supply | Agilent |
| E755 | N9030B PXA | 3 Hz-50 GHz Spectrum Analyser | Keysight |
| E759 | MX6-10-NH | 75-110 GHz x6 Multiplier | MMW Group |
| E781 | MX4-10-NH | 50-75 GHz x4 Multiplier | MMW Group |
| E296-5 | 11970V | 50-75 GHz Mixer | HP |
| E296-6 | 11970W | 75-110 GHz Mixer | HP |
| E503 | 25240-20 | 20 dB std. gain horn 50-75 G | fmi |
| 0410 | 2524-20 | 20 dB std. gain horn 50-75 G | fmi |
| E579 | 27240-20 | 20 dB std. gain horn 75-110 G | fmi |
| 0411 | 2724-20 | 20 dB std. gain horn 75-110 G | fmi |

The test enclosure used for the tests was fabricated by Shielding Solutions Ltd based on design input from RN Electronics Ltd. It was specifically configured for testing the shielding effectiveness of materials at high frequencies (>5 GHz).
Test Method:
  Based on IEEE 299: 2006
Test Standard:
  IEEE 299: 2006
Test Items:
  Gasket samples
Location:
  Test area A
Sample Plan:
  Measure at fixed distance of 30 cm, 25-100 GHz
Test Requirements:
  Measurement of non-woven CNT mat 25-100 GHz
  Effectiveness of the material relative to free-space.

The main objective of the test was to compare and assess the shielding performance of a number of gasket materials at high frequencies. These types of material are typically employed for shielding small scale electronic enclosures and the aim of the test was to evaluate the suitability of each material for use in devices operating at these high frequencies. The materials are listed below (CNT Materials manufactured by TorTech).
  MFS-NCRS001 Nickel over copper plated metallised polyester ripstop fabric
  C-267-H3B CNT mat 11 gsm
  C-279-H3B CNT mat 30 gsm
  C-279-H3B o CNT mat 30 gsm
  C-302-H2 60 gsm
  C-314-H2 PCU 900NM 19 gsm
  C-283-H3 36 gsm
  C-283-H3 100% epoxy circle
  Optiveil 20444A Cu+Ni coated carbon veil 20 gsm
  Aluminium foil 40u 108 gsm (For reference at 25-50 GHz)
  Ground aluminium disc 10 mm thick (for reference at 50-100 GHz)

Figure 38:
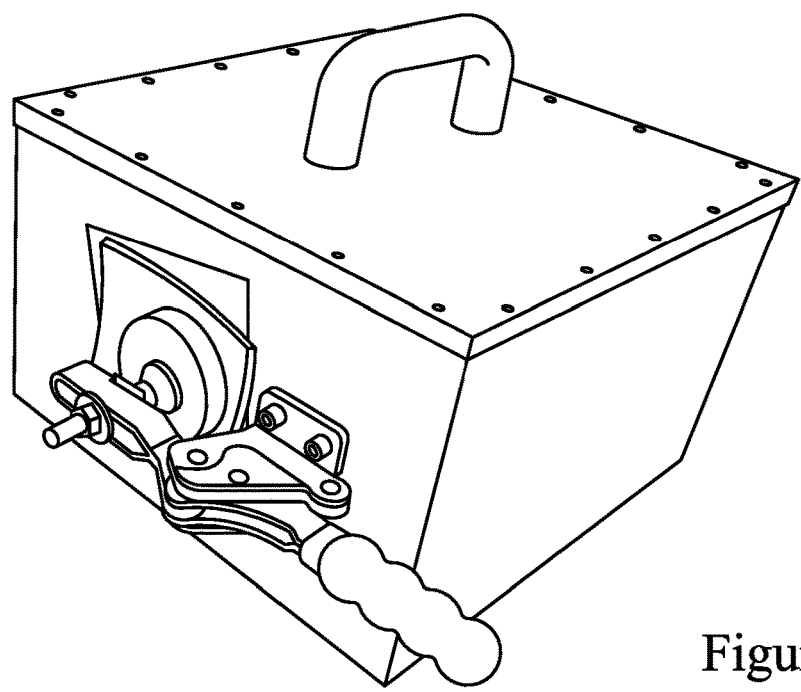
FIGS. 38 and 39 show the test set-up for Example 3 described below.
Figure 39:
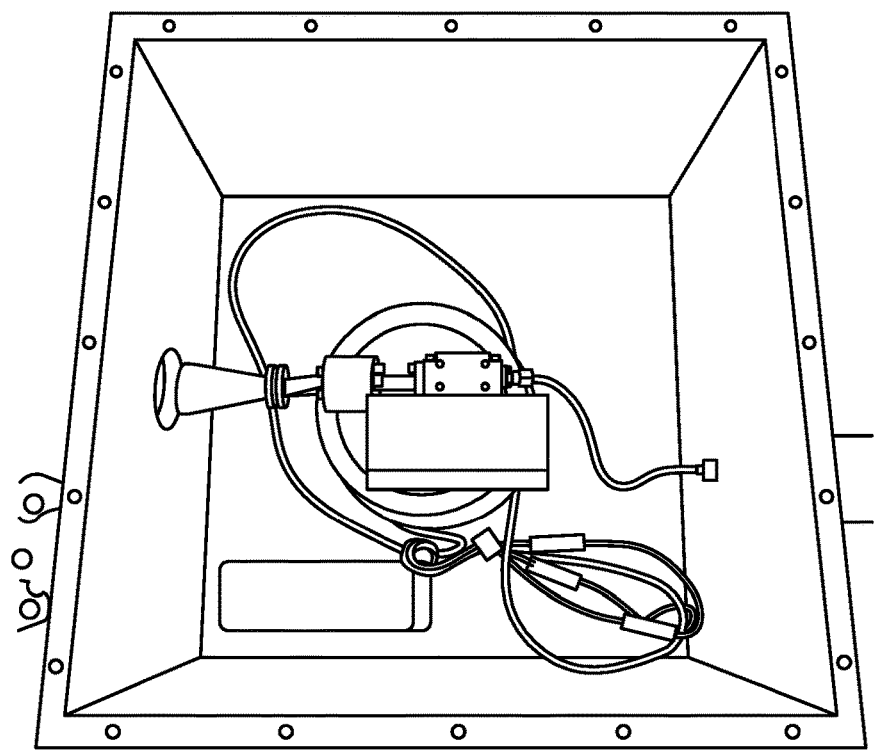
Figure 40:
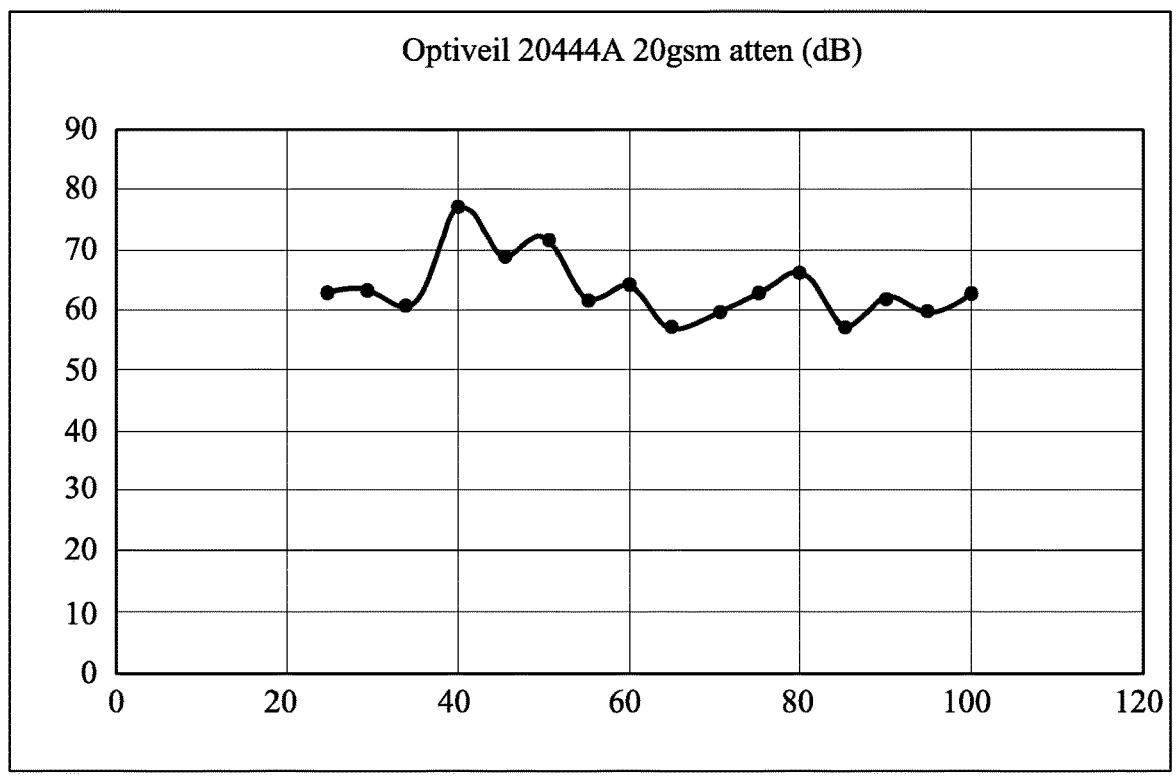
FIGS. 40 to 47 show the shielding performance for various gasket materials measured using the test set-up.
Figure 41:
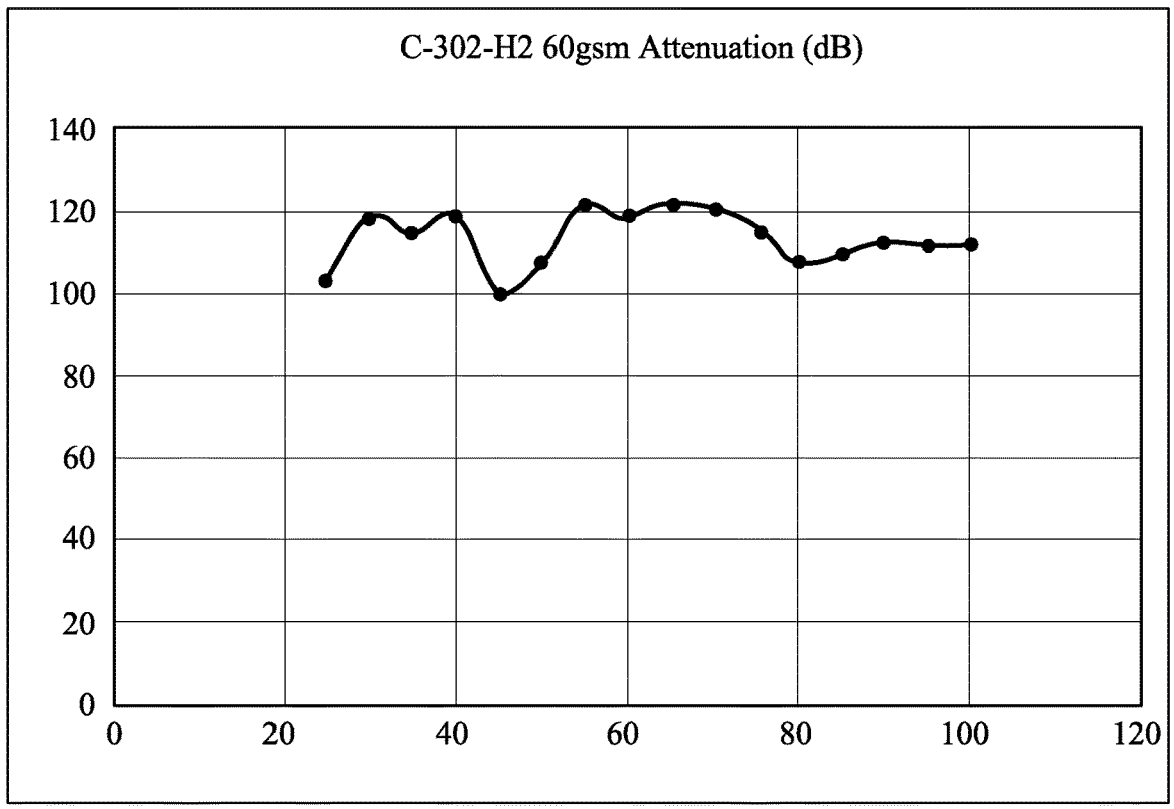
Figure 42:
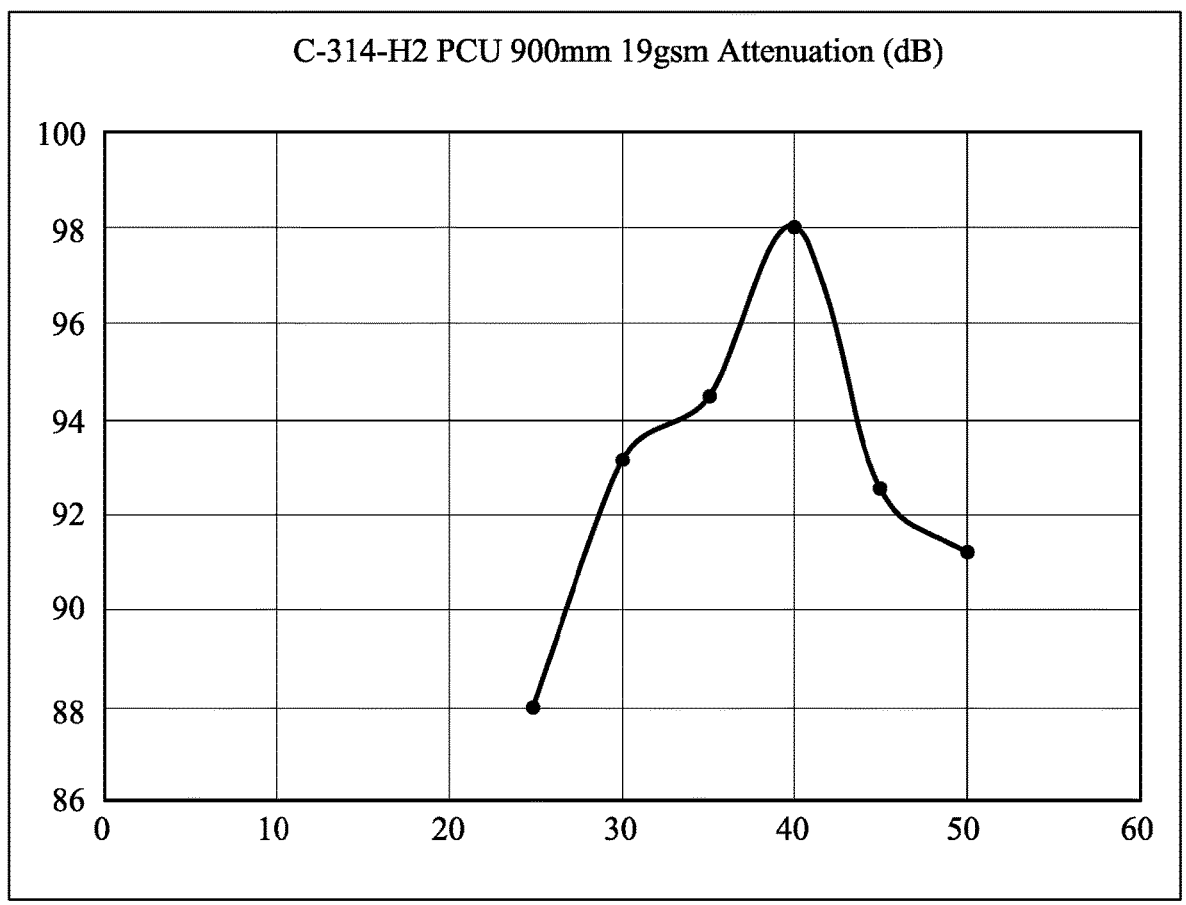
Figure 43:
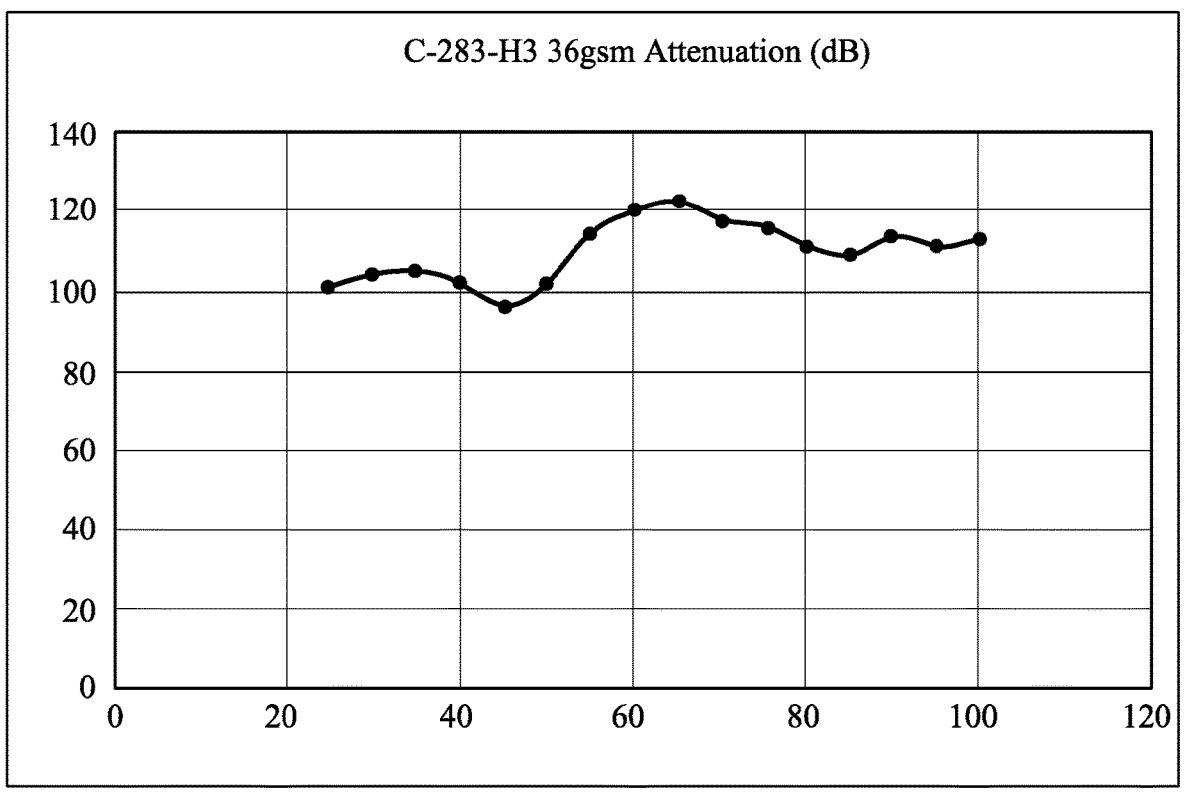
Figure 44:
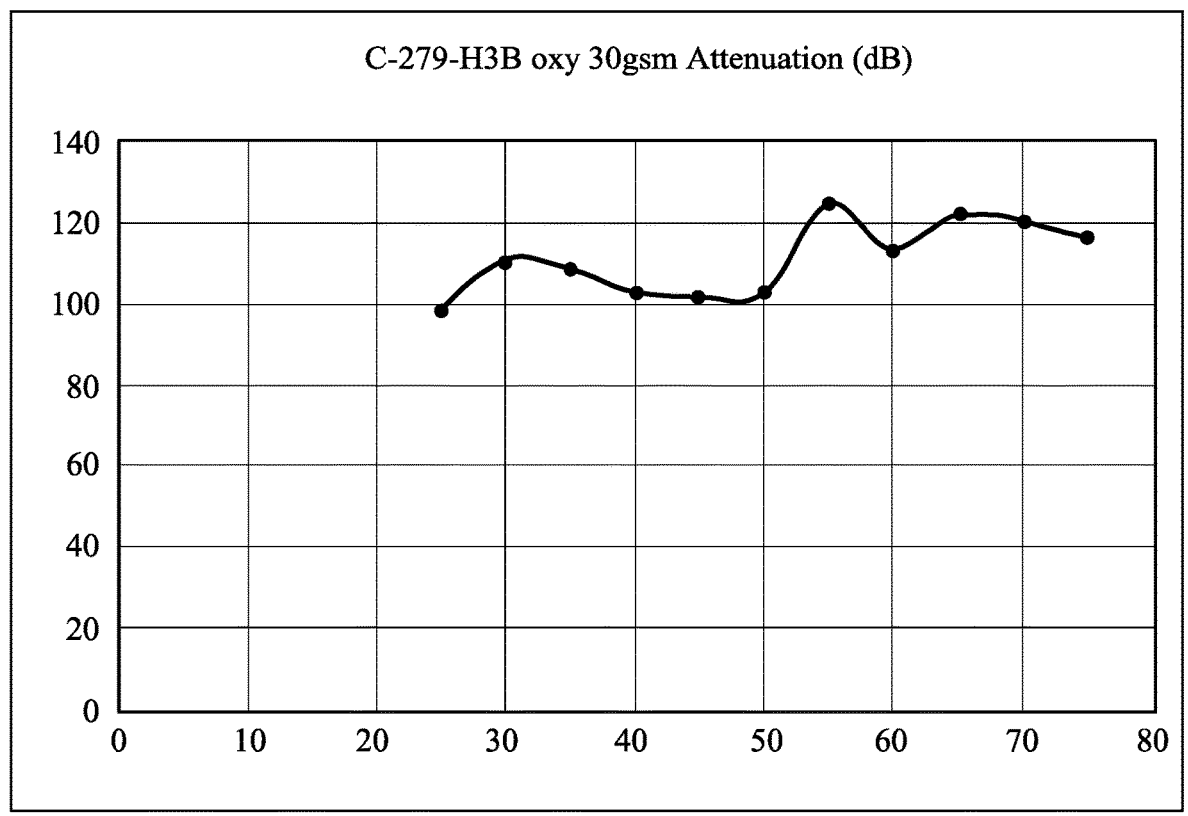
Figure 45:
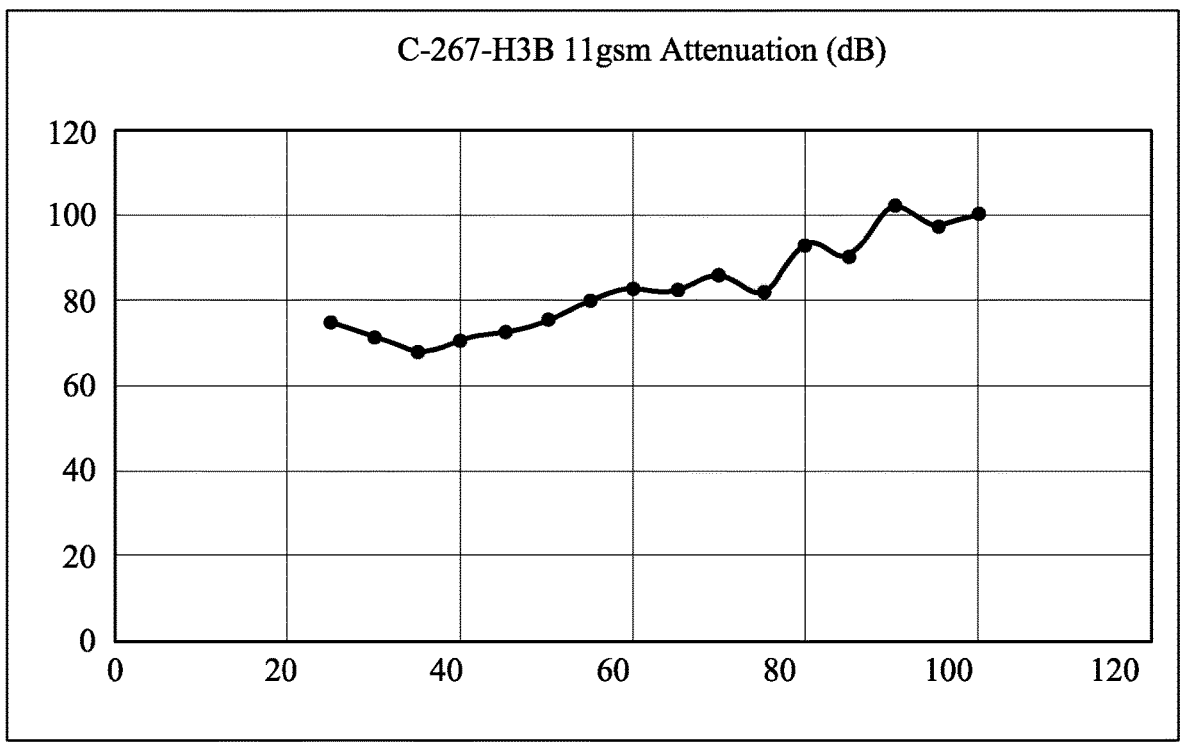
Figure 46:
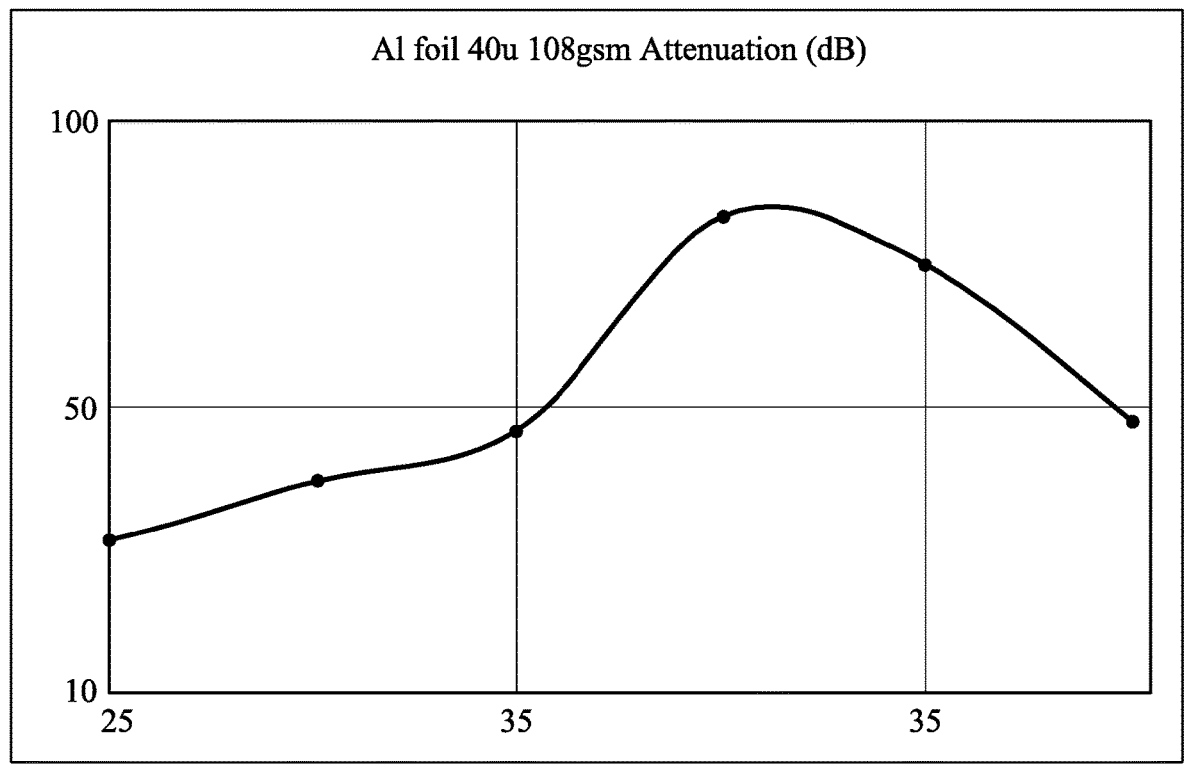
Figure 47:
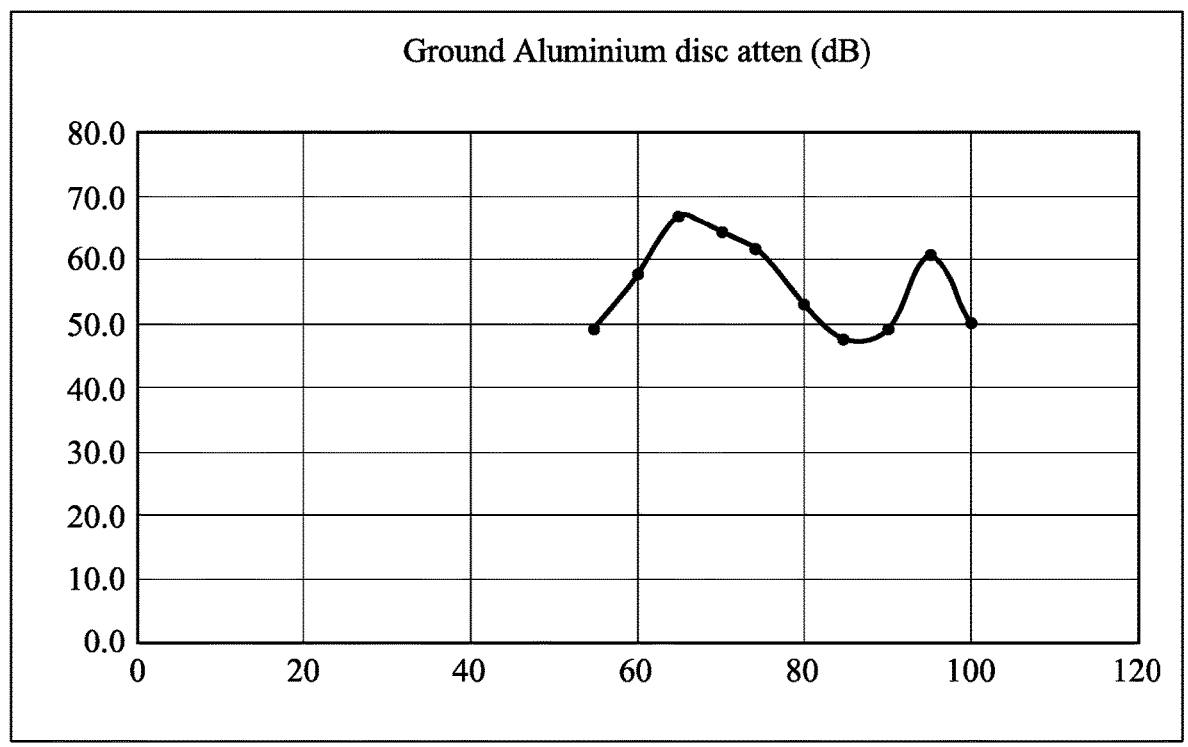

Each gasket disc was placed centrally over a 40 mm diameter hole in the front face of a test enclosure (see FIG. 38) with the frequency source inside (see FIG. 39). The gasket was held in place by a 50 mm diameter 10 mm thick Tufnell disc. The gasket was compressed using a single toggle clamp that was electrically insulated from the disc. This ensured that the only electrical connection between the disc and the enclosure was provided by the gasket. All of the gasket samples were subject to identical test procedures.

Results

The results of screening attenuation in dB relative to free-space and accompanying plot for each gasket type measured through a 50 mm round aperture in the test jig/screened box are shown in FIGS. 40-47.

The CNT materials also showed promise for use as an EMI shielding gasket material evidenced by how well they self-terminated on the aluminium surface of the enclosure aperture.

The invention claimed is:

1. An electromagnetic waveguide comprising:
   a first waveguide section;
   a second waveguide section;
   a first flange mounted on an end of the first waveguide section;
   a second flange mounted on an end of the second waveguide section, wherein the first flange is connected to the second flange; and
   an EMI shielding gasket mounted between the first flange and the second flange, wherein the EMI shielding gasket includes a self-supporting body of non-woven carbon nanotubes adapted to incorporate one or more apertures, wherein the self-supporting body of non-woven carbon nanotubes comprises a first aperture of the one or more apertures for electromagnetic radiation and a second aperture of the one or more apertures for receiving a fastener which connects to at least one of the first flange or the second flange.

2. An electromagnetic waveguide as claimed in claim 1 wherein the self-supporting body of non-woven carbon nanotubes is coated.

3. An electromagnetic waveguide as claimed in claim 1 wherein the coating is a partial coating.

4. An electromagnetic waveguide as claimed in claim 2 wherein the coating impregnates the self-supporting body of non-woven carbon nanotubes.

5. An electromagnetic waveguide as claimed in claim 1 wherein the self-supporting body of non-woven carbon nanotubes is coated with a polymer.

6. An electromagnetic waveguide as claimed in claim 5 wherein the polymer is a non-conductive polymer.

7. An electromagnetic waveguide as claimed in claim 6 wherein the non-conductive polymer is a fluoropolymer.

8. An electromagnetic waveguide as claimed in claim 6 wherein the non-conductive polymer is polyvinylidene difluoride (PVDF) or a copolymer or terpolymer thereof.

9. An electromagnetic waveguide as claimed in claim 5 wherein the polymer is a conductive polymer.

10. An electromagnetic waveguide as claimed in claim 5 wherein the polymer is polyvinylpyrrolidone (PVP).

11. An electromagnetic waveguide as claimed in claim 1 wherein the areal density of the self-supporting body of non-woven carbon nanotubes is 60 gsm or less.

12. An electromagnetic waveguide as claimed in claim 1 wherein the areal density of the self-supporting body of non-woven carbon nanotubes is 20 gsm or less.

13. An electromagnetic waveguide as claimed in claim 1 wherein the surface of the self-supporting body of non-woven carbon nanotubes is non-uniform.

14. An electromagnetic waveguide as claimed in claim 1 wherein the thickness of the self-supporting body of non-woven carbon nanotubes is subject to variation by up to 20%.

15. An electromagnetic waveguide as claimed in claim 1 obtainable or obtained from a process comprising:
   (a) introducing a flow of metal catalyst or metal catalyst precursor into a temperature-controlled flow-through reactor;
   (b) introducing a flow of a source of carbon into the temperature-controlled flow-through reactor;
   (c) exposing the metal catalyst or metal catalyst precursor and source of carbon to temperature zones sufficient to generate particulate metal catalyst and to produce carbon nanotubes;
   (d) displacing the carbon nanotubes as a continuous discharge through a discharge outlet of the temperature-controlled flow-through reactor;
   (e) collecting the continuous discharge in the form of a self-supporting body of non-woven carbon nanotubes; and
   (f) adapting the self-supporting body of non-woven carbon nanotubes to incorporate one or more apertures.

16. An EMI shielding gasket as defined in claim 1, wherein the EMI shielding gasket seals a joint between the first flange and the second flange.

17. An EMI shielding gasket as defined in claim 1, wherein the self-supporting body of non-woven carbon nanotubes includes a profile that is planar and matching a profile of at least the first flange or the second flange.

18. An electromagnetic waveguide as claimed in claim 1, wherein at least one of the first waveguide section or the second waveguide section includes an elongate hollow conduit.

19. An electromagnetic waveguide as claimed in claim 15, wherein the metal catalyst is at least one of: Fe, Ru, Co, W, Cr, Mo, Rh, Ir, Os, Ni, Pd, Pt, Ru, Y, La, Ce, Mn, Pr, Nd, Tb, Dy, Ho, Er, Lu, Hf, Li or Gd.

20. An electromagnetic waveguide as claimed in claim 19, wherein the metal catalyst precursor includes at least one of a metal complex or an organometallic metal compound.

* * * * *